(12) United States Patent
Lee

(10) Patent No.: US 9,754,987 B2
(45) Date of Patent: Sep. 5, 2017

(54) IMAGE SENSORS AND METHODS OF FORMING THE SAME

(71) Applicant: Yun Ki Lee, Seoul (KR)

(72) Inventor: Yun Ki Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/994,330

(22) Filed: Jan. 13, 2016

(65) Prior Publication Data

US 2016/0204144 A1    Jul. 14, 2016

(30) Foreign Application Priority Data

Jan. 13, 2015    (KR) .................. 10-2015-0006011

(51) Int. Cl.
| | | |
|---|---|---|
| H01L 27/146 | (2006.01) | |
| H01L 27/148 | (2006.01) | |
| H01L 31/0232 | (2014.01) | |
| H01L 23/552 | (2006.01) | |

(52) U.S. Cl.
CPC ...... *H01L 27/1463* (2013.01); *H01L 27/1464* (2013.01); *H01L 27/14623* (2013.01); *H01L 27/14643* (2013.01); *H01L 27/14687* (2013.01); *H01L 27/14689* (2013.01); *H01L 27/14621* (2013.01); *H01L 27/14627* (2013.01)

(58) Field of Classification Search
CPC .......... H01L 27/1463; H01L 27/14623; H01L 27/1464; H01L 27/14643; H01L 27/14687; H01L 27/14689; H04N 5/361
USPC ............... 257/229, 294, 432, 435, 446, 659, 257/E27.13, E27.15, E27.133, E27.134, 257/E31.002, E31.121; 438/70, 75, 80, 438/164; 216/41, 93

See application file for complete search history.

(56) References Cited

U.S. PATENT DOCUMENTS

| | | | |
|---|---|---|---|
| 7,737,479 B2 | 6/2010 | Wen et al. | |
| 7,772,616 B2 | 8/2010 | Naya | |
| 7,800,684 B2 | 9/2010 | Tatani | |
| 8,334,189 B2 | 12/2012 | Kao | |
| 8,519,502 B2 | 8/2013 | Kameda et al. | |
| 8,686,482 B2 | 4/2014 | Lee | |
| 8,729,678 B2 * | 5/2014 | Shim ................ | H01L 27/14623 257/294 |
| 9,029,969 B2 * | 5/2015 | Endo ..................... | H04N 5/361 257/435 |
| 2006/0011813 A1* | 1/2006 | Park .................... | H01L 27/1462 250/208.1 |
| 2012/0001286 A1* | 1/2012 | Yoon ................. | H01L 27/14618 257/432 |
| 2012/0012961 A1* | 1/2012 | Kataoka ........... | H01L 27/14621 257/432 |

(Continued)

FOREIGN PATENT DOCUMENTS

KR    1020060077071 A    7/2006

*Primary Examiner* — Dao H Nguyen
(74) *Attorney, Agent, or Firm* — Harness, Dickey & Pierce, P.L.C.

(57) ABSTRACT

An image sensor includes a substrate including a light-receiving region and a light-shielding region, a device isolation pattern in the substrate of the light-receiving region to define active pixels, and a device isolation region in the substrate of the light-shielding region to define reference pixels. An isolation technique of the device isolation pattern is different from that of the device isolation region.

19 Claims, 23 Drawing Sheets

(56) References Cited

U.S. PATENT DOCUMENTS

| | | |
|---|---|---|
| 2012/0025059 A1* | 2/2012 | Kawashima ...... H01L 27/14623 250/208.1 |
| 2013/0113968 A1 | 5/2013 | Lenchenkov et al. |
| 2013/0307110 A1* | 11/2013 | Kwon ................. H01L 27/1463 257/460 |
| 2014/0036119 A1 | 2/2014 | Shimomura et al. |
| 2014/0048689 A1 | 2/2014 | Pain et al. |
| 2014/0110809 A1 | 4/2014 | Kitamura et al. |

* cited by examiner

IMAGE SENSORS AND METHODS OF FORMING THE SAME

CROSS-REFERENCE TO RELATED APPLICATION

This U.S. non-provisional patent application claims priority under 35 U.S.C. §119 to Korean Patent Application No. 10-2015-0006011, filed on Jan. 13, 2015, in the Korean Intellectual Property Office, the disclosure of which is hereby incorporated by reference in its entirety.

BACKGROUND

The inventive concepts relate to image sensors including device isolation patterns and/or methods of forming the same.

An image sensor is a semiconductor device that converts an optical image into electrical signals. Image sensors may be categorized as any one of charge coupled device (CCD)-type image sensors and complementary metal-oxide-semiconductor (CMOS)-type image sensors. CIS is short for the CMOS-type image sensor. The CIS may include a plurality of pixels two-dimensionally arranged, and each of the pixels may include a photodiode (PD). The photodiode may convert incident light into an electrical signal.

SUMMARY

Example embodiments of the inventive concepts may provide image sensors capable of improving optical characteristics and methods of forming the same.

In at least one example embodiment, an image sensor may include a substrate including a light-receiving region and a light-shielding region, a device isolation pattern in the substrate of the light-receiving region configured to define active pixels, and a device isolation region in the substrate of the light-shielding region configured to define reference pixels. The device isolation pattern may include a different material from the device isolation region.

In at least one example embodiment, the device isolation pattern may include an insulating material filling a trench in the substrate.

In at least one example embodiment, the device isolation pattern may include a first device isolation pattern in the light-receiving region, and a second device isolation pattern between the reference pixels in the light-shielding region. A shape of the second device isolation pattern may be different from a shape of the first device isolation pattern.

In at least one example embodiment, the device isolation region may be a dopant region formed by doping a portion of the substrate with dopants.

In at least one example embodiment, the image sensor may further include a photoelectric conversion part in the substrate of each of the active pixels and the reference pixels.

In at least one example embodiment, structures of the photoelectric conversion parts in the reference pixels may be the same as or symmetrical to those of the photoelectric conversion parts in the active pixels.

In at least one example embodiment, the device isolation pattern may include a material of which a refractive index is lower than that of the substrate.

In at least one example embodiment, the substrate may further include a dummy region between the light-receiving region and the light-shielding region. The dummy region may have a plurality of dummy pixels.

In at least one example embodiment, the device isolation region may be further in the dummy region to define the dummy pixels.

In at least one example embodiment, the device isolation pattern may include a first device isolation pattern in the light-receiving region, and a second device isolation pattern between the dummy pixels in the dummy region. A shape of the second device isolation pattern may be different from a shape of the first device isolation pattern.

In at least one example embodiment, an image sensor may include a substrate including active pixels and reference pixels. The active pixels may be defined by a device isolation pattern filling a trench formed in the substrate, and the reference pixels may be defined by a dopant region formed by doping a portion of the substrate with dopants.

In at least one example embodiment, the image sensor may further include a photoelectric conversion part in the substrate of each of the active pixels and the reference pixels.

In at least one example embodiment, the photoelectric conversion parts may be adjacent to a first surface of the substrate, and the trench may extend from a second surface of the substrate into the substrate. The second surface may be opposite to the first surface.

In at least one example embodiment, the image sensor may further include a shallow device isolation layer in the substrate to define active regions. The shallow device isolation layer may be adjacent to the first surface of the substrate.

In at least one example embodiment, the image sensor may further include transfer gates on the first surface of the substrate and on the photoelectric conversion parts, respectively, an interconnection structure covering the transfer gates on the first surface of the substrate, and a color filter and a micro-lens on the second surface of the substrate of each of the active pixels.

In at least one example embodiment, the dopant region may be doped with dopants of a first conductivity type, and the photoelectric conversion parts may be doped with dopants of a second conductivity type different from the first conductivity type.

In at least one example embodiment, the reference pixels may have the same shape and the same area as the active pixels when viewed from a plan view.

In at least one example embodiment, the image sensor may further include a light-shielding pattern on the substrate to cover the reference pixels. The active pixels may be exposed by the light-shielding pattern.

In at least one example embodiment, a method of forming an image sensor may include providing a substrate including a light-receiving region and a light-shielding region, injecting dopants into the substrate to form a device isolation region defining reference pixels in the light-shielding region, etching the substrate to form a trench in the light-receiving region, and forming a device isolation pattern in the trench to define active pixels in the light-receiving region.

In at least one example embodiment, injecting the dopants into the substrate may be performed on a first surface of the substrate, and etching the substrate may be performed on a second surface of the substrate. The second surface may be opposite to the first surface.

In at least one example embodiment, the substrate of the light-shielding region may not be exposed when the trench is formed.

In at least one example embodiment, the method may further include performing a doping process on the first surface of the substrate to form photoelectric conversion parts in the substrate. The photoelectric conversion parts may be formed in the active and reference pixels, respectively.

In at least one example embodiment, a method of forming an image sensor includes injecting dopants into a substrate to form a device isolation region, the device isolation region defining reference pixels, etching the substrate to form a trench, and forming a device isolation pattern in the trench to define active pixels. The injecting dopants into the substrate may include injecting dopants on at least one of a first surface of the substrate and a second surface of the substrate. The second surface is opposite to the first surface. The substrate is not exposed when the trench is formed. The method may also include performing a doping process on the first surface of the substrate to form photoelectric conversion parts in the substrate. The photoelectric conversion parts may be formed in the active and reference pixels, respectively.

BRIEF DESCRIPTION OF THE DRAWINGS

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

DETAILED DESCRIPTION OF THE EMBODIMENTS

Figure 1:
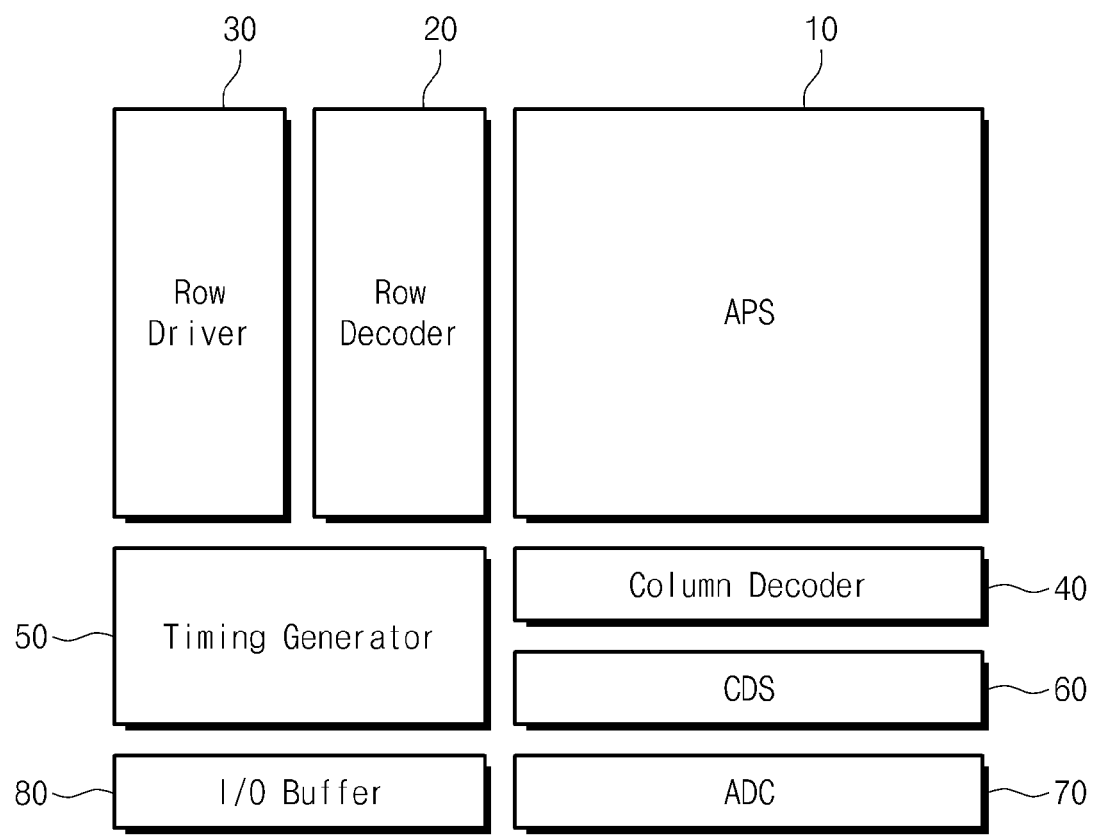
FIG. 1 is a schematic block diagram illustrating an image sensor according to at least one example embodiment of the inventive concepts.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
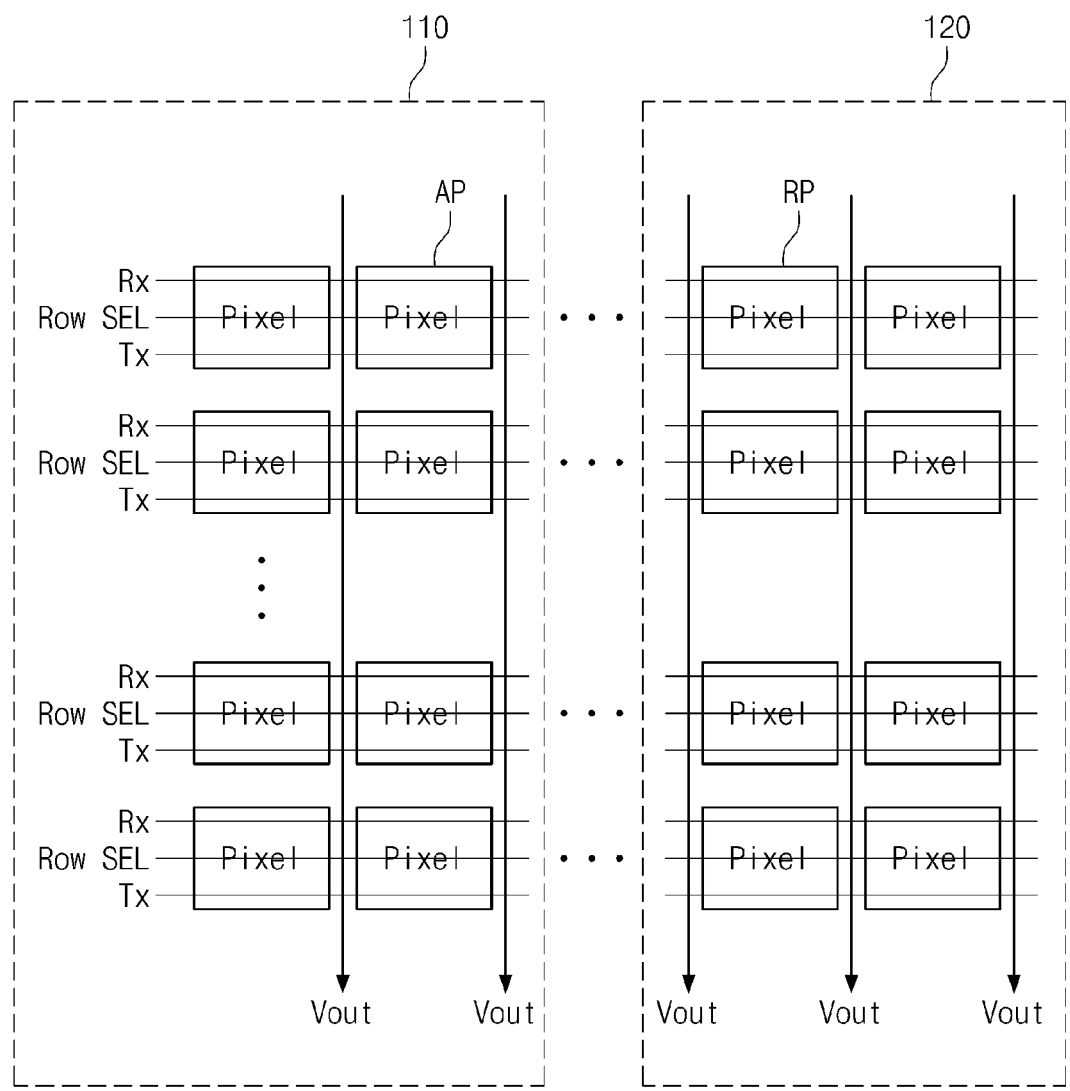
FIG. 2 is a schematic circuit diagram illustrating a sensor array of an image sensor according to at least one example embodiment of the inventive concepts.

FIG. 1 is a schematic block diagram illustrating an image sensor according to at least one example embodiment of the inventive concepts. FIG. 2 is a schematic circuit diagram illustrating a sensor array of an image sensor according to at least one example embodiment of the inventive concepts.

Referring to FIG. 1, an image sensor according to at least one example embodiment of the inventive concepts may include an active pixel sensor (APS) array 10, a row decoder 20, a row driver 30, a column decoder 40, a timing generator 50, a correlated double sampler (CDS) 60, an analog-to-digital converter (ADC) 70, and an input/output (I/O) buffer 80.

As shown in FIG. 2, the APS array 10 may include a light-receiving region 110 and a light-shielding region 120, and may include two-dimensionally arranged unit pixels. Light may be incident on the light-receiving region 110, but may not be incident on the light-shielding region 120. The unit pixels may include active pixels AP and reference pixels RP. The active pixels AP may be in the light-receiving region 110, and may convert the incident light into electrical signals. The reference pixels RP may be in the light-shielding region 120, and may generate an electrical signal that occurs in a unit pixel on which light is not incident. The unit pixels of the light-receiving region 110 and the light-shielding region 120 may be driven by a plurality of driving signals (e.g., a row selection signal Row SEL, a reset signal Rx, and a charge transfer signal Tx), which are provided from the row driver 30 (shown in FIG. 1). In addition, electrical signals generated in the APS array 10 may be provided to the correlated double sampler 60.

As shown in FIG. 1, the row driver 30 may provide the plurality of driving signals for driving the unit pixels to the APS array 10 in response to resultant signals decoded in the row decoder 20. If the unit pixels are arranged in a matrix form, the row driver 30 may provide the driving signals to the unit pixels of each of rows.

The timing generator 50 may provide a timing signal and a control signal to the row decoder 20 and the column decoder 40.

The correlated double sampler 60 may receive the electrical signals generated from the APS array 10, and may hold and sample the received electrical signals. The correlated double sampler 60 may sample both a specific noise level and a signal level by the electrical signal to output a difference level corresponding to a difference between the noise level and the signal level.

The analog-to-digital converter 70 may convert an analog signal corresponding to the difference level provided from the correlated double sampler 60 into a digital signal and may output the converted digital signal.

The I/O buffer 80 may latch the digital signals, and the latched signals may be sequentially transmitted to an image signal treatment part (not shown) in response to a resultant signal decoded in the column decoder 40.

Figure 3:
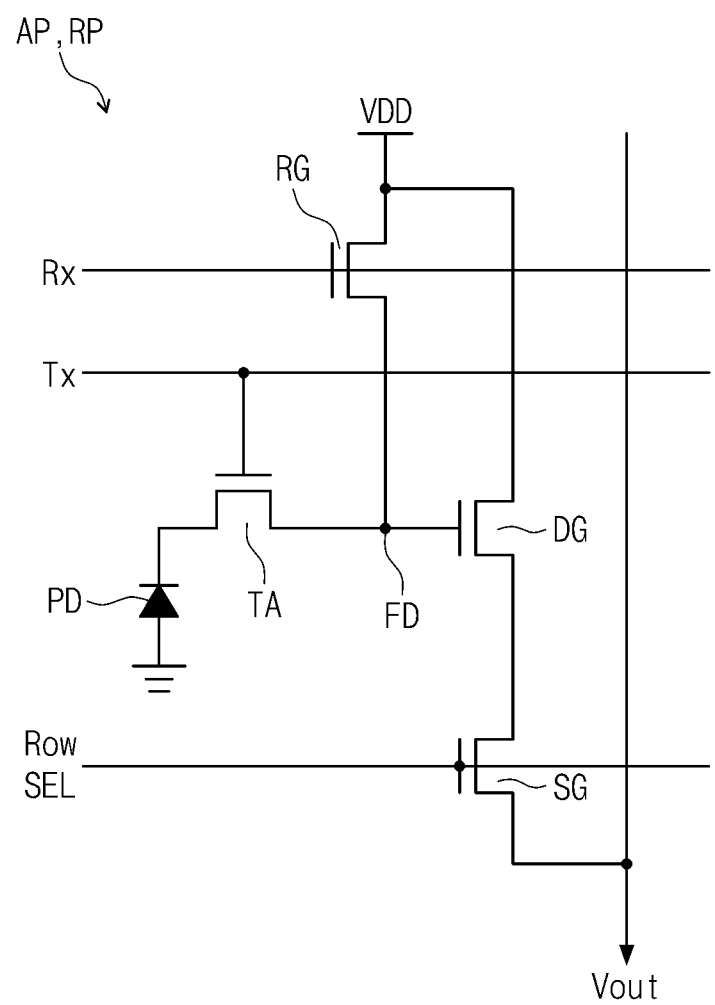
FIG. 3 is a circuit diagram illustrating a unit pixel of an image sensor according to at least one example embodiment of the inventive concepts.

FIG. 3 is a circuit diagram illustrating a unit pixel of an image sensor according to at least one example embodiment of the inventive concepts.

Referring to FIG. 3, each of the unit pixels AP and RP may include a photoelectric conversion part PD converting incident light into an electrical signal and sensing elements sensing the electrical signal generated in the photoelectric conversion part PD. The sensing elements may include a transfer element TA, a reset element RG, a driver element DG, and a selection element SG. The driving signals Tx, Rx and Row SEL of the transfer element TA, the reset element RG, and the selection element SG may be applied in common to the unit pixels of the same row. In at least one example embodiment, the transfer element TA, the reset element RG, the driver element DG, and the selection element SG may be field effect transistors.

The photoelectric conversion part PD may generate and accumulate charges corresponding to the incident light. In at least one example embodiment, the photoelectric conversion part PD may include at least one of a photodiode, a photo transistor, a photo gate, or a pinned photodiode (PPD). The photoelectric conversion part PD may be connected to the transfer element TA used to transfer the accumulated charges to a floating diffusion region FD.

The floating diffusion region FD may receive the charges accumulated in the photoelectric conversion part PD. The floating diffusion region FD may have a parasitic capacitance, so the charges may be accumulatively stored in the floating diffusion region FD. In addition, the floating diffusion region FD may be electrically connected to the driver element DG to control the driver element DG.

The transfer element TA may transfer the charges from the photoelectric conversion part PD to the floating diffusion region FD. The transfer element TA may generally consist of one element and may be controlled by the transfer signal Tx.

The reset element RG may periodically reset the floating diffusion region FD and may be controlled by the reset signal Rx. A source of the reset element RG may be connected to the floating diffusion region FD, and a drain of the reset element RG may be connected to a power voltage VDD. Thus, if the reset element RG is turned on by the reset signal Rx, the power voltage VDD connected to the drain of the reset element RG may be transferred to the floating diffusion region FD.

The driver element DG may be coupled to a constant-current source (not shown) to act as a source follower buffer amplifier. The driver element DG may amplify a variation in an electrical potential of the floating diffusion region FD receiving the photo charges from the photoelectric conversion part PD and may output the amplified variation in the electrical potential to an output line V out.

The selection element SG may select the unit pixels of a selected row. The selection element SG may be driven by the row selection signal Row SEL. If the selection element SG is turned on, the power voltage VDD connected to a drain of the selection element SG may be transferred to the drain of the driver element DG.

According to at least one example embodiment as illustrated in FIG. 3, the unit pixel may have a four-element structure including four elements. However, the inventive concepts are not limited thereto. In at least one example embodiment, the unit pixel may have a three-element structure including three elements, a five-element structure including five elements, or a photo gate structure similar to the four-element structure. In at least one example embodiment, the unit pixels may share at least one of the elements.

Hereinafter, image sensors according to at least one example embodiment of the inventive concepts will be described in detail.

Figure 4A:
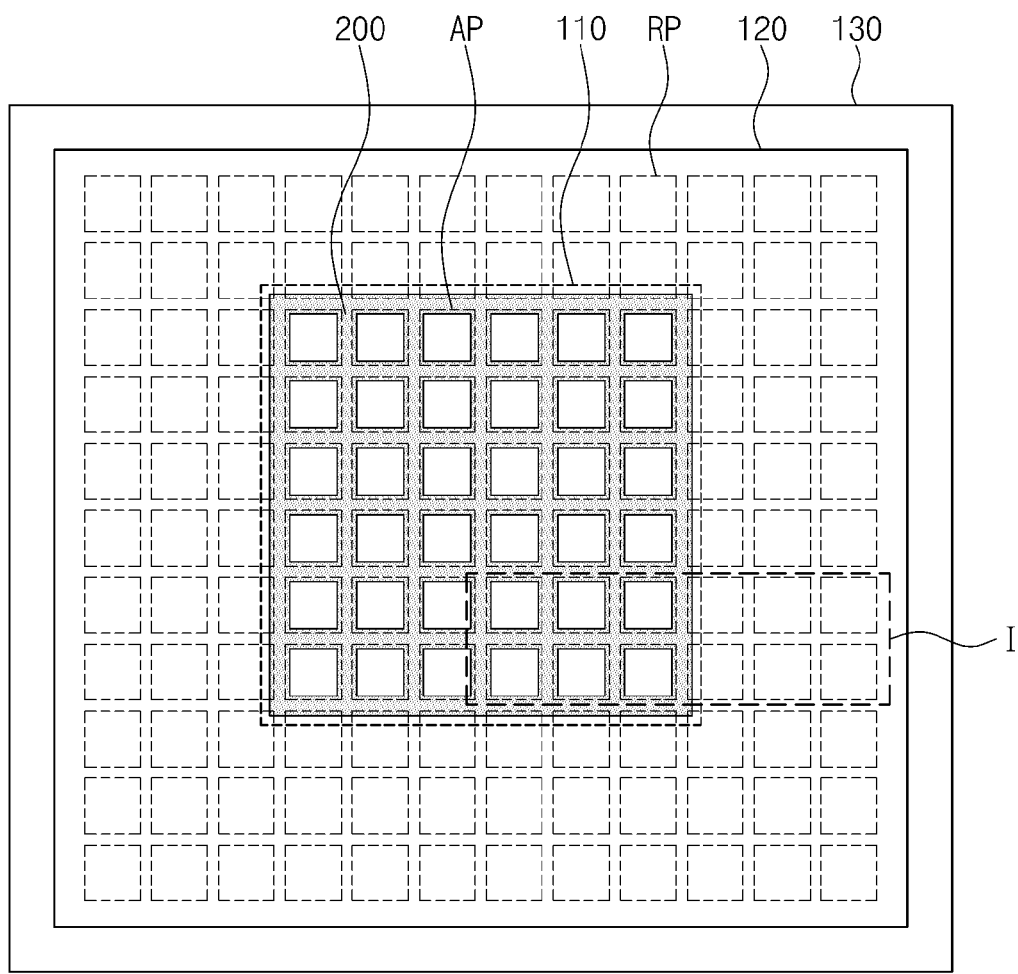
FIGS. 4A and 4B are schematic plan views illustrating image sensors according to at least one example embodiment of the inventive concepts.
Figure 4B:
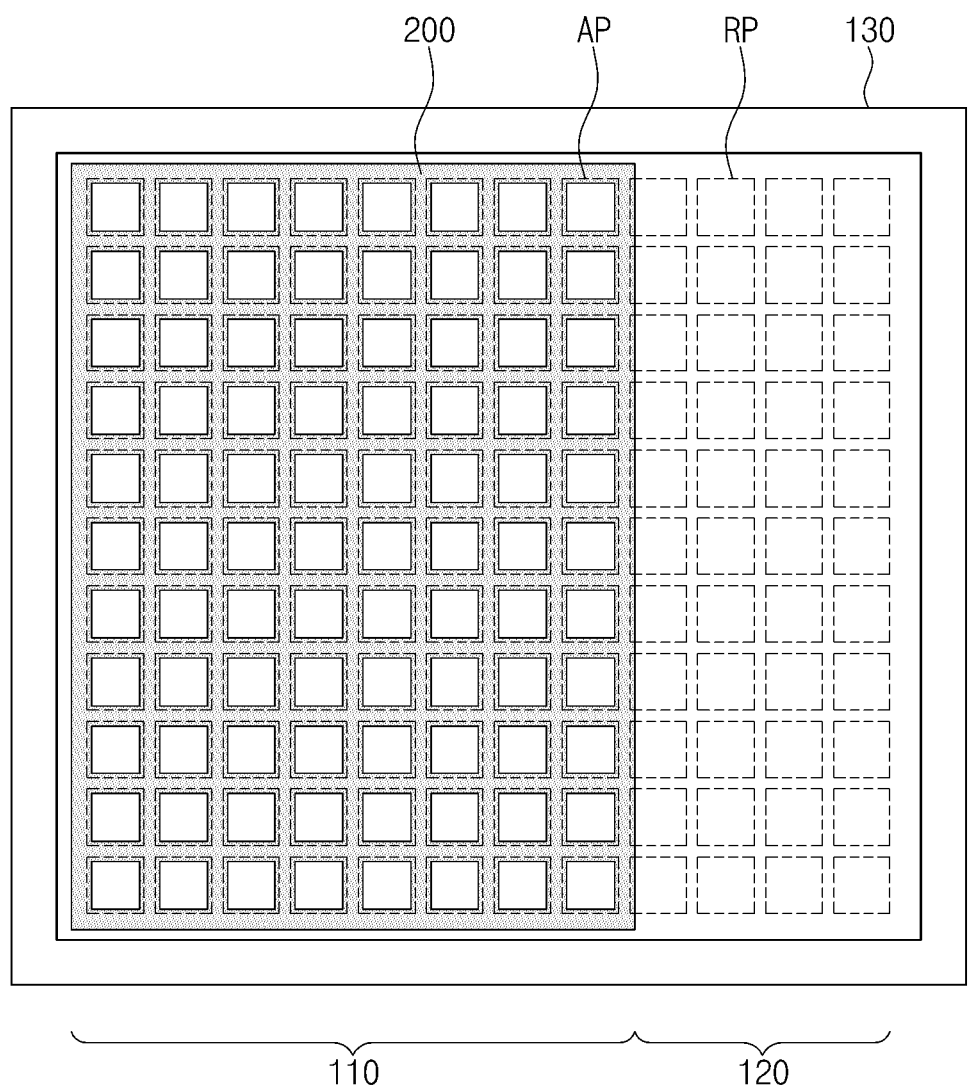

FIGS. 4A and 4B are schematic plan views illustrating image sensors according to at least one example embodiment of the inventive concepts.

Referring to FIGS. 4A and 4B, an image sensor may include the APS array 10 (shown in FIG. 1) including the light-receiving region 110, the light-shielding region 120, and pad region 130.

As described with reference to FIG. 2, a plurality of unit pixels may be arranged in a matrix form in the APS array 10. Electrical signals generated by incident light may be provided from the APS array 10. The pad region 130 may include conductive pads that are used to transmit control signals to the APS array 10 and/or to receive photoelectric signals from the APS array 10. The pad region 130 may be around the APS array 10 so as to be easily connected to an external system. In other words, the pad region 130 may correspond to an edge portion of the image sensor.

The APS array 10 in which the unit pixels are arranged may include the light-receiving region 110 and the light-shielding region 120. The light may be incident on the light-receiving region 110, but may not be incident on the light-shielding region 120. According to example embodiment, the light-shielding region 120 may be between the light-receiving region 110 and the pad region 130. In at least one example embodiment, the light-shielding region 120 may be around the light-receiving region 110, as illustrated in FIG. 4A. Alternatively, the light-shielding region 120 may be at a side of the light-receiving region 110, as illustrated in FIG. 4B. However, example embodiments of the inventive concepts are not limited thereto. In at least one example embodiment, the positions of the light-receiving region 110 may be modified.

Figure 5A:
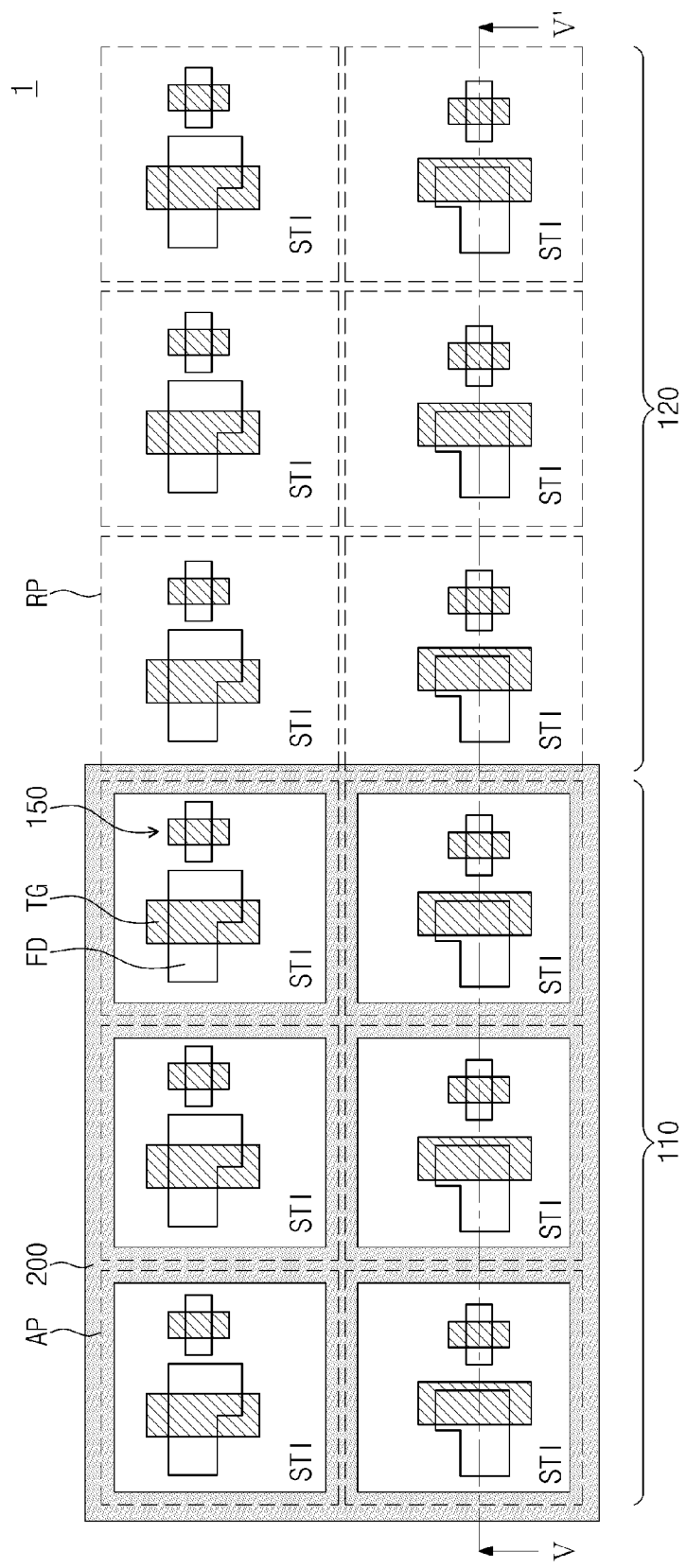
FIG. 5A is an enlarged plan view of a region 'I' of FIG. 4A to illustrate an image sensor according to at least one example embodiment of the inventive concepts.
Figure 5B:
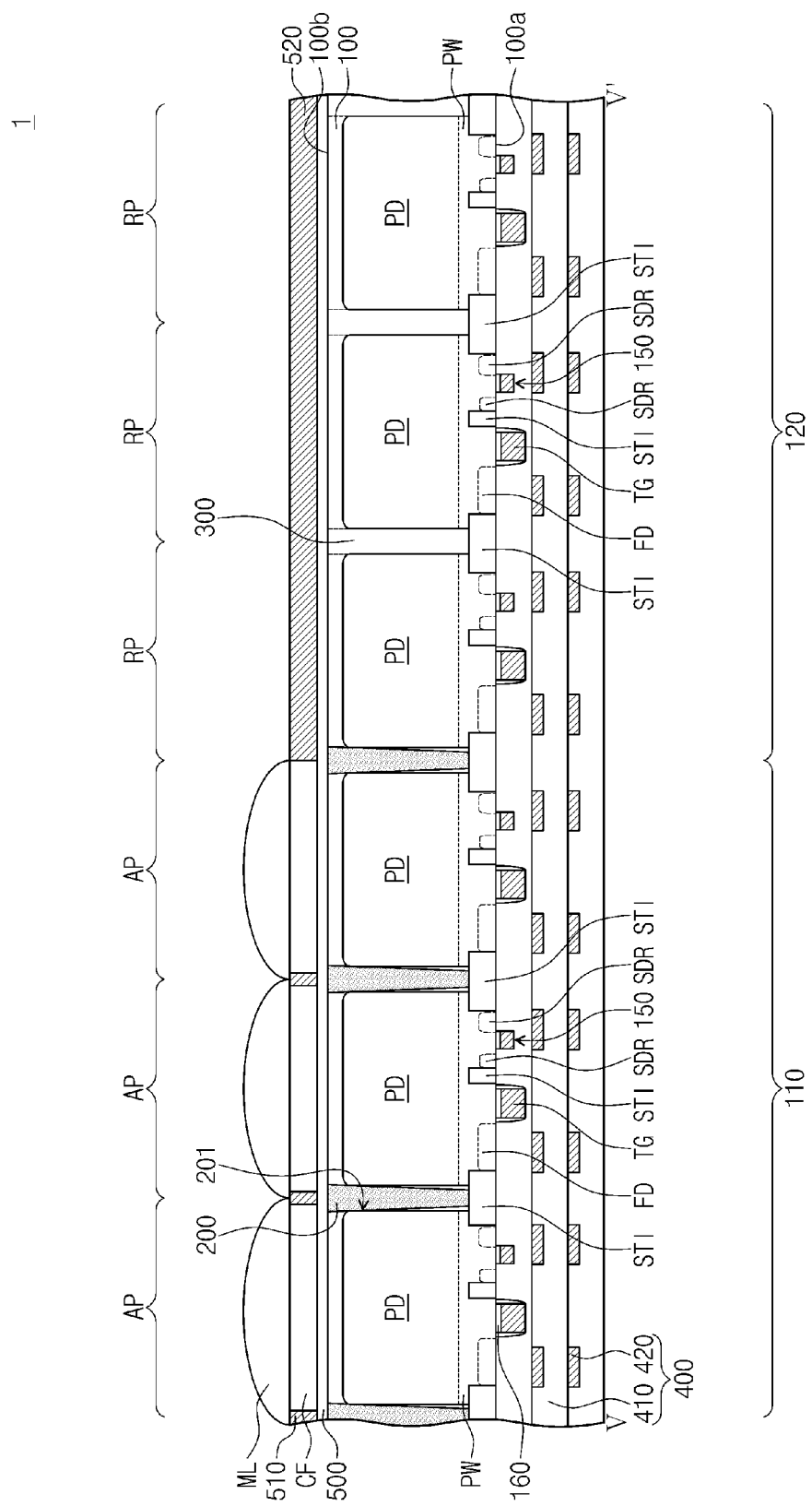
FIG. 5B is a cross-sectional view taken along a line V-V of FIG. 5A.

FIG. 5A is an enlarged plan view of a region 'I' of FIG. 4A, which illustrates an image sensor according to at least one example embodiment of the inventive concepts. FIG. 5B is a cross-sectional view taken along a line V-V' of FIG. 5A. Hereinafter, the descriptions mentioned above will be omitted or mentioned briefly to avoid duplication of explanation.

Referring to FIGS. 5A and 5B, an image sensor 1 may include a substrate 100 having a light-receiving region 110, a light-shielding region 120, a device isolation pattern 200, photoelectric conversion parts PD, transfer gates TG, and a light-shielding pattern 520. The light-shielding region 120 may be covered with the light-shielding pattern 520. The substrate 100 may have a first surface 100a and a second surface 100b that are opposite to each other. The first surface 100a may correspond to a front side of the substrate 100, and the second surface 100b may correspond to a back side of the substrate 100. In at least one example embodiment, the substrate 100 may be a semiconductor substrate (e.g., a silicon substrate, a germanium substrate, a silicon-germanium substrate, a II-VI group compound semiconductor substrate, a III-V group compound semiconductor substrate, or a silicon-on-insulator (SOI) substrate).

The light-receiving region 110 and the light-shielding region 120 may be defined by the device isolation pattern 200. The device isolation pattern 200 may also be in the light-receiving region 110 to define active pixels AP. The device isolation pattern 200 may have a depth of about 0.3 µm to about 6 µm. The device isolation pattern 200 may be spaced apart from the first surface 100a of the substrate 100. In at least one example embodiment, the device isolation pattern 200 may penetrate the substrate 100 so as to be exposed at the first and second surfaces 100a and 100b. In at least one example embodiment, the device isolation pattern 200 may extend onto the second surface 100b of the substrate 100 to cover the second surface 100b. According to at least one example embodiment, as shown in FIG. 5B, the device isolation pattern 200 may not extend into and/or between reference pixels RP of the light-shielding region 120.

The device isolation pattern 200 may be a deep-trench isolation pattern. In at least one example embodiment, the device isolation pattern 200 may include an insulating material that fills a trench 201 recessed from the second surface 100b of the substrate 100. A width of a top surface of the device isolation pattern 200 may be wider than that of a bottom surface of the device isolation pattern 200. Here, the top surface of the device isolation pattern 200 may be adjacent to the second surface 100b of the substrate 100, and the bottom surface of the device isolation pattern 200 may be adjacent to the first surface 100a of the substrate 100. The device isolation pattern 200 may include at least one of, but not limited to, silicon oxide, silicon nitride, or silicon oxynitride. The device isolation pattern 200 may include a single insulating layer or a plurality of insulating layers. The device isolation pattern 200 may include a material of which a refractive index is lower than that of the substrate 100, so crosstalk between the active pixels AP may be minimized and/or prevented.

The active pixels AP may output electrical signals (e.g., photoelectric signals) generated by the incident light. Defects (e.g., dangling bonds) caused by etch stress may occur at an interface between the device isolation pattern 200 and the substrate 100. A liner (not shown) or a doped region (not shown), which is used to cure the interface defects between the device isolation pattern 200 and the substrate 100, may not be provided. In this case, the charges may be generated by heat as well as the incident light because of the interface defects between the device isolation pattern 200 and the substrate 100. The charges generated by the interface defects may be transferred to the photoelectric conversion part PD to generate a dark current. The active pixel AP may output an electrical signal (e.g., a noise signal) generated by the charges caused by the heat, as well as the photoelectric signal. The noise signal occurring in the active pixel AP may include a signal generated by the dark current.

A device isolation region 300 may be in the light-shielding region 120 of the substrate 100 to define the reference pixels RP. As illustrated in FIG. 5A, the reference pixels RP may have the same planar area and the same volume as the active pixels AP. The device isolation region 300, shown in FIG. 5B, may include a different material from the device isolation pattern 200. The light may not be incident on the light-shielding region 120, so optical crosstalk may not occur between the reference pixels RP. The reference pixels RP may not output the photoelectric signal. In at least one example embodiment, the reference pixels RP may not output the photoelectric signal but may output only electrical signals (e.g., noise signals) generated by charges caused by heat.

A method of isolating the reference pixels RP by the device isolation region 300 may be different from the method of isolating the active pixels AP by the device isolation pattern 200. For example, the device isolation region 300 may define the reference pixels RP by a junction isolation technique. The device isolation region 300 may be a dopant region formed in the substrate 100. The device isolation region 300 may be doped with dopants of a different conductivity type from dopants of the photoelectric conversion part PD. For example, the device isolation region 300 may be doped with dopants of a first conductivity type (e.g., P-type dopants). Since the device isolation region 300 includes the dopant region, interface defects may not occur between the device isolation region 300 and the substrate 100. The reference pixels RP may be defined by the device isolation region 300 instead of the device isolation pattern 200, so the dark current may be reduced or prevented in the reference pixels RP. In other words, the mean value (e.g., a reference signal) of electrical signals generated from the reference pixels RP may not include the noise signal generated by the dark current. The noise signal, generated by the dark current, of the electrical signal occurring in the active pixel AP may be removed using the reference signal. As described above, the dark current of the active pixel AP may occur by the interface defects between the device isolation pattern 200 and the substrate 100. As a result, even though the liner layer (not shown) or the doped region (not shown) is not formed at the interface between the device isolation pattern 200 and the substrate 100, the image sensor 1 may output the electrical signal from which the noise signal by the dark current is removed. In other words, optical characteristics of the image sensor 1 may be improved.

The photoelectric conversion part PD may be formed in the substrate 100 of each of the active and reference pixels AP and RP. The photoelectric conversion part PD in each of the reference pixels RP may be the substantially same as the photoelectric conversion part PD in each of the active pixels AP. For example, a structure, a shape and a position of the photoelectric conversion part PD in the reference pixel RP may be the same as or symmetrical to those of the photoelectric conversion part PD in the reference pixel RP. The photoelectric conversion part PD in the reference pixel RP may include the same material as the photoelectric conversion part PD in the reference pixel RP. The photoelectric conversion part PD may be a dopant region that is doped with dopants of a second conductivity type in the substrate 100. For example, the dopants of the second conductivity type may be N-type dopants. Here, the second conductivity type may be different from the first conductivity type of the device isolation region 300. The photoelectric conversion part PD may include a well region PW. The well region PW may be doped with dopants of the first conductivity type, e.g., P-type dopants. The well region PW may be adjacent to the first surface 100a of the substrate 100.

A transfer gate TG and at least one element 150 may be on each of the active and reference pixels AP and RP of the substrate 100. The transfer gate TG may correspond to a gate of the transfer element TA illustrated in FIG. 3. In at least one example embodiment, the transfer gate TG may have a flat-type structure that is on the first surface 100a of the substrate 100. Alternatively, the transfer gate TG may have a buried-type structure that extends from the surface 100a of the substrate 100 into the substrate 100. The structure of the transfer gate TG on the reference pixel RP may be the same as and/or symmetrical to that of the transfer gate TG on the active pixel AP. The at least one element 150 may correspond to at least one of the reset element RG, the driver element DG, and the selection element SG (shown in FIG. 3). A gate insulating layer 160 may be between the substrate 100 and the transfer gate TG.

A shallow device isolation layer STI may be on the first surface 100a of the substrate 100. The shallow device isolation layer STI may include at least one of silicon oxide, silicon nitride, and silicon oxynitride. The shallow device isolation layer STI may be shallower than the device isolation pattern 200. As illustrated in FIG. 5A, the shallow device isolation layer STI may define an active region in each of the active and reference pixels AP and RP. The active region may include a region used to operate the transfer gate TG and the element 150. For example, the active region may include a floating diffusion region FD and source/drain regions SDR, as illustrated in FIG. 5B. The floating diffusion region FD and the source/drain regions SDR may be in the substrate 100 of each of the active and reference pixels AP and RP and may be adjacent to the first surface 100a of the substrate 100. The source/drain regions SDR may correspond to a source and a drain of the element 150. The floating diffusion region FD and the source/drain regions SDR may be dopant regions doped with N-type dopants.

An interconnection structure 400 may be on the first surface 100a of the substrate 100. The interconnection structure 400 may include interlayer insulating layers 410 and interconnections 420. In the image sensor 1 according to at least one example embodiment of the inventive concepts, the light may be incident on the second surface 100b of the substrate 100. The interconnection structure 400 may be on the first surface 100a of the substrate 100, so photoelectric conversion efficiency of the image sensor 1 may be improved.

An anti-reflection layer 500 may be on the second surface 100b of the substrate 100 to cover the device isolation pattern 200. A grid pattern 510 may be between color filters CF on the anti-reflection layer 500. In at least one example embodiment, the grid pattern 510 may be omitted.

The light-shielding pattern 520 may be at the same level as the grid pattern 510 on the anti-reflection layer 500. The light-shielding pattern 520 may be on the second surface 100b of the substrate 100, and the anti-reflection layer 500 may be between the light-shielding pattern 520 and the second surface 100b. The light-shielding pattern 520 may cover the light-shielding region 120, but may not cover the light-receiving region 110. Thus, the light incident on the second surface 100b of the substrate 100 may be incident on the light-receiving region 110, but may not be incident on the light-shielding region 120. A material and a thickness of the light-shielding pattern 520 may be the same as those of the grid pattern 510.

The color filter CF and a micro-lens ML may be on the anti-reflection layer 500 of each of the active pixels AP. The color filter CF and the micro-lens ML may not be on the light-shielding region 120. The color filters CF may be arranged in a matrix form and may constitute a color filter array.

FIGS. 6A to 8A are plan views illustrating image sensors according to at least one example embodiment of the inventive concepts. FIGS. 6B to 8B are cross-sectional views taken along lines VI-VI', VII-VII', and VIII-VIII' of FIGS. 6A to 8A, respectively. Hereinafter, the descriptions mentioned above will be omitted or mentioned briefly to avoid duplication of explanation.

Referring to FIGS. 6A to 8A and 6B to 8B, an image sensor 2, 3, or 4 may include a substrate 100 having a light-receiving region 110 and a light-shielding region 120. A plurality of active pixels AP may be in the light-receiving region 110, and a plurality of reference pixels RP may be in the light-shielding region 120. A shallow device isolation layer STI, a photoelectric conversion part PD, a well region PW, a floating diffusion region FD, and source/drain regions SDR may be in the substrate 100 of each of the pixels AP and RP. A transfer gate TG and at least one element 150 may be on the surface 100a of the substrate 100 of each of the pixels AP and RP. The photoelectric conversion parts PD, the well regions PW, the floating diffusion regions FD and the transfer gates TG, which are in the reference pixels RP, may the substantially same as the photoelectric conversion parts PD, the well regions PW, the floating diffusion regions FD, and the transfer gates TG, which are in the active pixels AP. The photoelectric conversion parts PD may include dopants of the second conductivity type (e.g., N-type dopants). The interconnection structure 400 may be on the first surface 100a of the substrate 100 to cover the transfer gates TG and the elements 150.

An anti-reflection layer 500, a grid pattern 510, color filters CF, and micro-lenses ML may be on the second surface 100b of the substrate 100. A light-shielding pattern 520 may be on the anti-reflection layer 500. The light-shielding pattern 520 may cover the light-shielding region 120 but may not cover the light-receiving region 110. In at least one example embodiment, the grid pattern 510 may be omitted.

A device isolation region 300 may be in the light-shielding region 120 of the substrate 100 to define the reference pixels RP. The device isolation region 300 may be a dopant region which is formed by doping a portion of the substrate 100 with dopants. The dopants of the device isolation region 300 may have a different conductivity type from those of the photoelectric conversion part PD. The device isolation region 300 may define the reference pixels RP by a junction isolation technique. The device isolation region 300 may include dopants of the first conductivity type (e.g., P-type dopants). Interface defects caused by etching may not be generated between the device isolation region 300 and the substrate 100. Since the reference pixels RP are defined by the device isolation region 300, a dark current of the reference pixels RP may be reduced and/or minimized.

A device isolation pattern 200 may include a first device isolation pattern 210 and a second device isolation pattern 220. The first and second device isolation patterns 210 and 220 may be in a trench 201 recessed from the second surface 100b of the substrate 100. The first and second device isolation patterns 210 and 220 may include an insulating material of which a refractive index is lower than that of the substrate 100. The first and second device isolation patterns 210 and 220 may include a different material from the substrate 100, so interfaces may be between the substrate 100 and the first and second device isolation patterns 210 and 220. The first and second device isolation patterns 210 and 220 may include a different material from the device isolation region 300. The first device isolation pattern 210 may define the active pixels AP in the light-receiving region 110 of the substrate 100. In at least one example embodiment, the first device isolation pattern 210 may also be between the light-receiving region 110 and the light-shielding region 120 to separate the light-receiving region 110 from the light-shielding region 120.

The second device isolation pattern 220 may be in the light-shielding region 120 of the substrate 100. A structure, a shape, and arrangement of the second device isolation pattern 220 may be different from those of the first device isolation pattern 210. Hereinafter, device isolation patterns 200 of the image sensors 2, 3 and 4 will be described in more detail.

Figure 6A:
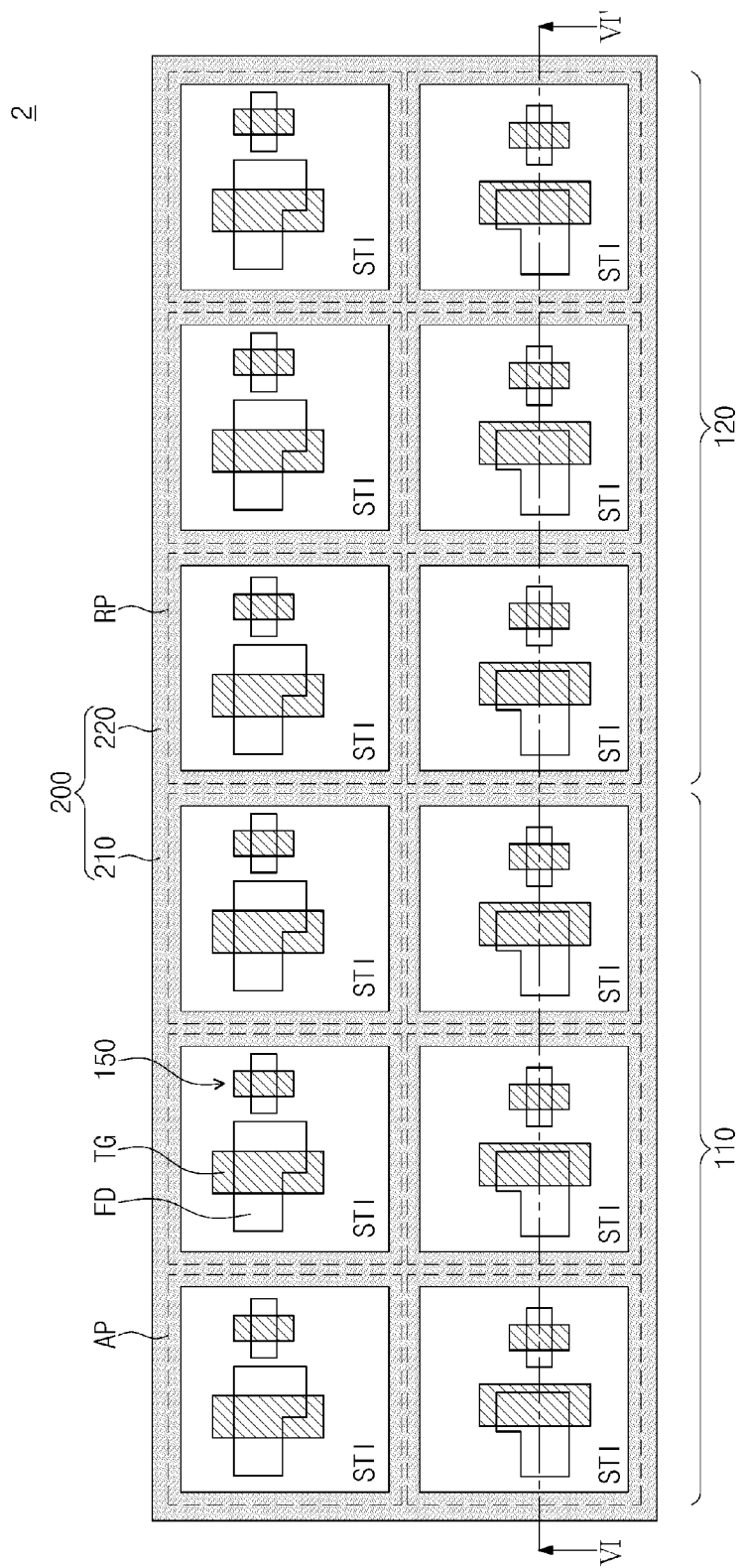
FIG. 6A is a plan view illustrating an image sensor according to at least one example embodiment of the inventive concepts.
Figure 6B:
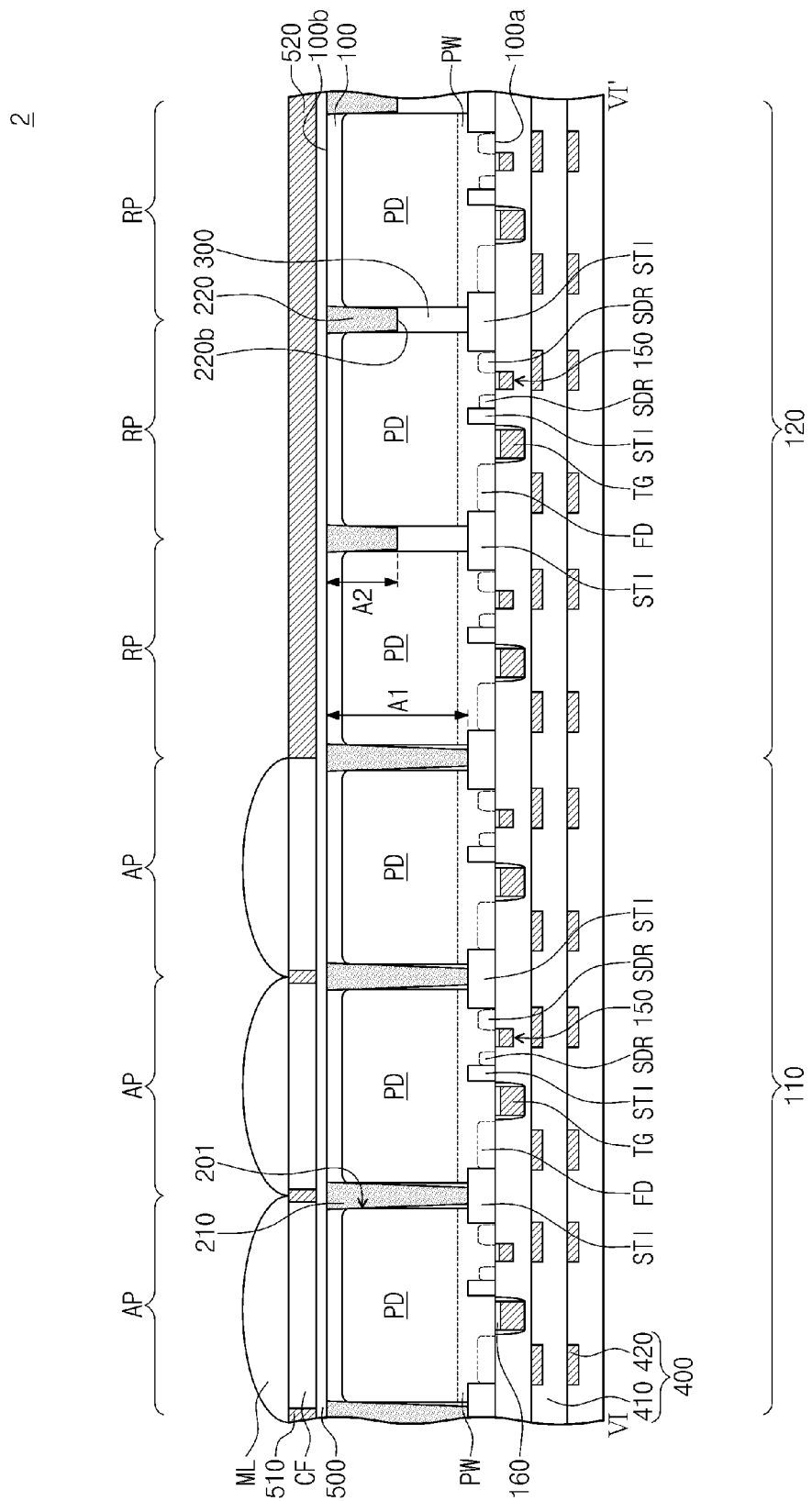
FIG. 6B is a cross-sectional view taken along a line VI-VI of FIG. 6A.

In at least one example embodiment illustrated in FIGS. 6A and 6B, a depth A2 of the second device isolation pattern 220 may be smaller than a depth A1 of the first device isolation pattern 210. The second device isolation pattern 220 may be in the device isolation region 300. In at least one example embodiment, a bottom surface 220b of the second device isolation pattern 220 may be within the device isolation region 300.

Figure 7A:
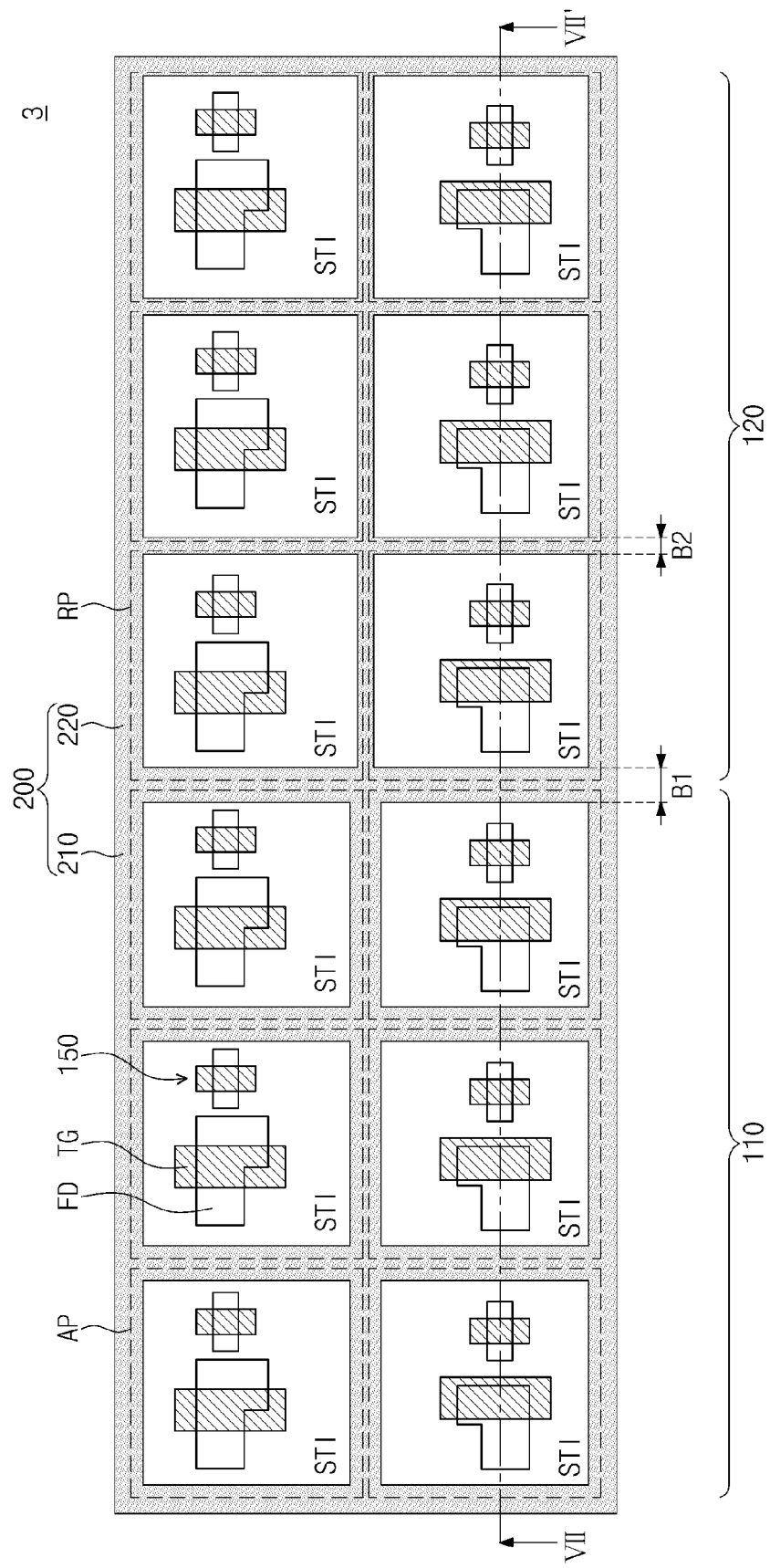
FIG. 7A is a plan view illustrating an image sensor according to at least one example embodiment of the inventive concepts.
Figure 7B:
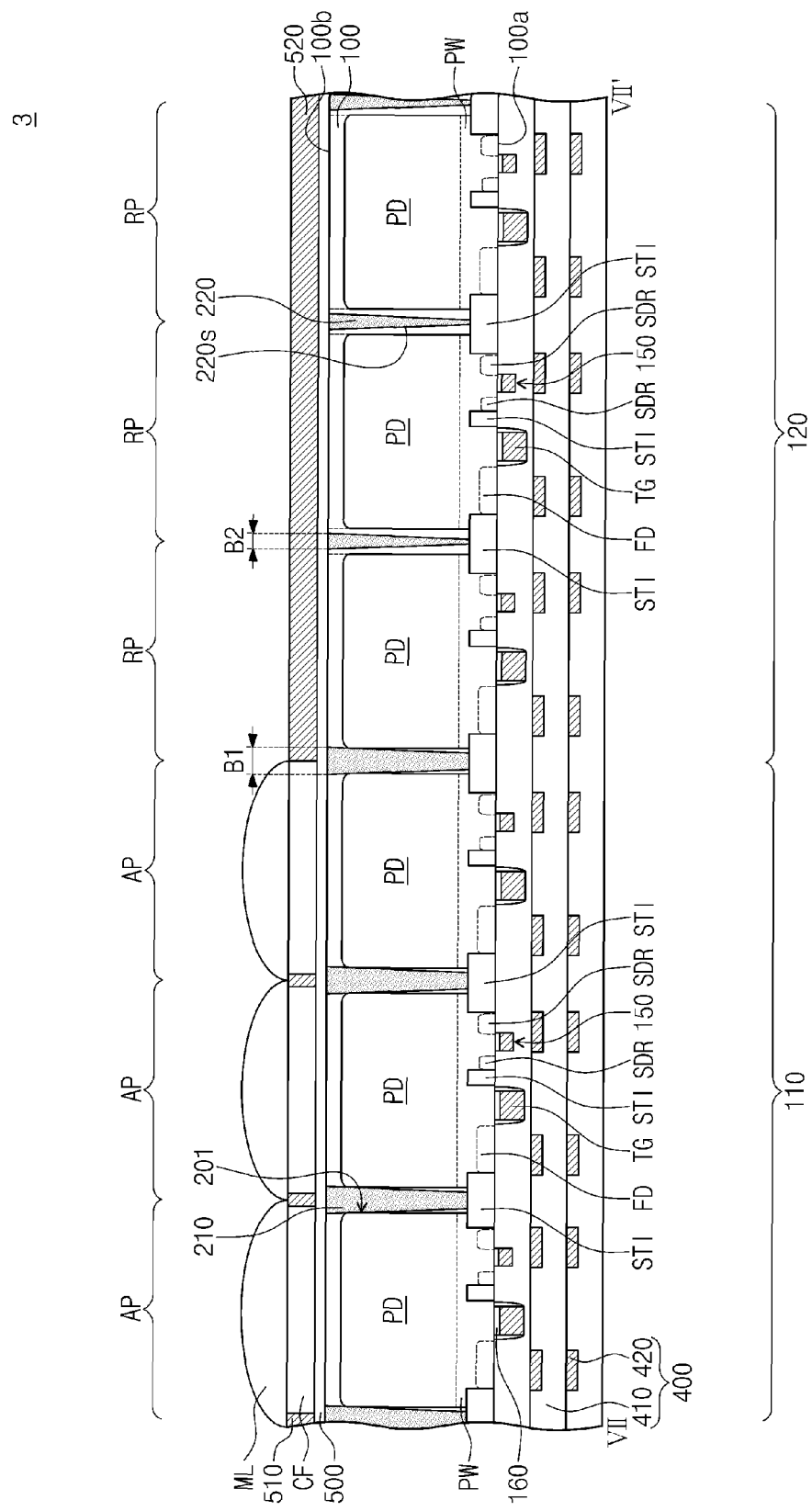
FIG. 7B is a cross-sectional view taken along a line VII-VII of FIG. 7A.

In at least one example embodiment illustrated in FIGS. 7A and 7B, a width B2 of the second device isolation pattern 220 may be narrower than a width B1 of the first device isolation pattern 210. Here, the widths B1 and B2 of the first and second device isolation patterns 210 and 220 may be values measured at the same level. The second device isolation pattern 220 may be in the device isolation region 300. For example, a sidewall 220s of the second device isolation pattern 220 may be within the device isolation region 300 and may be covered by the device isolation region 300.

Figure 8A:
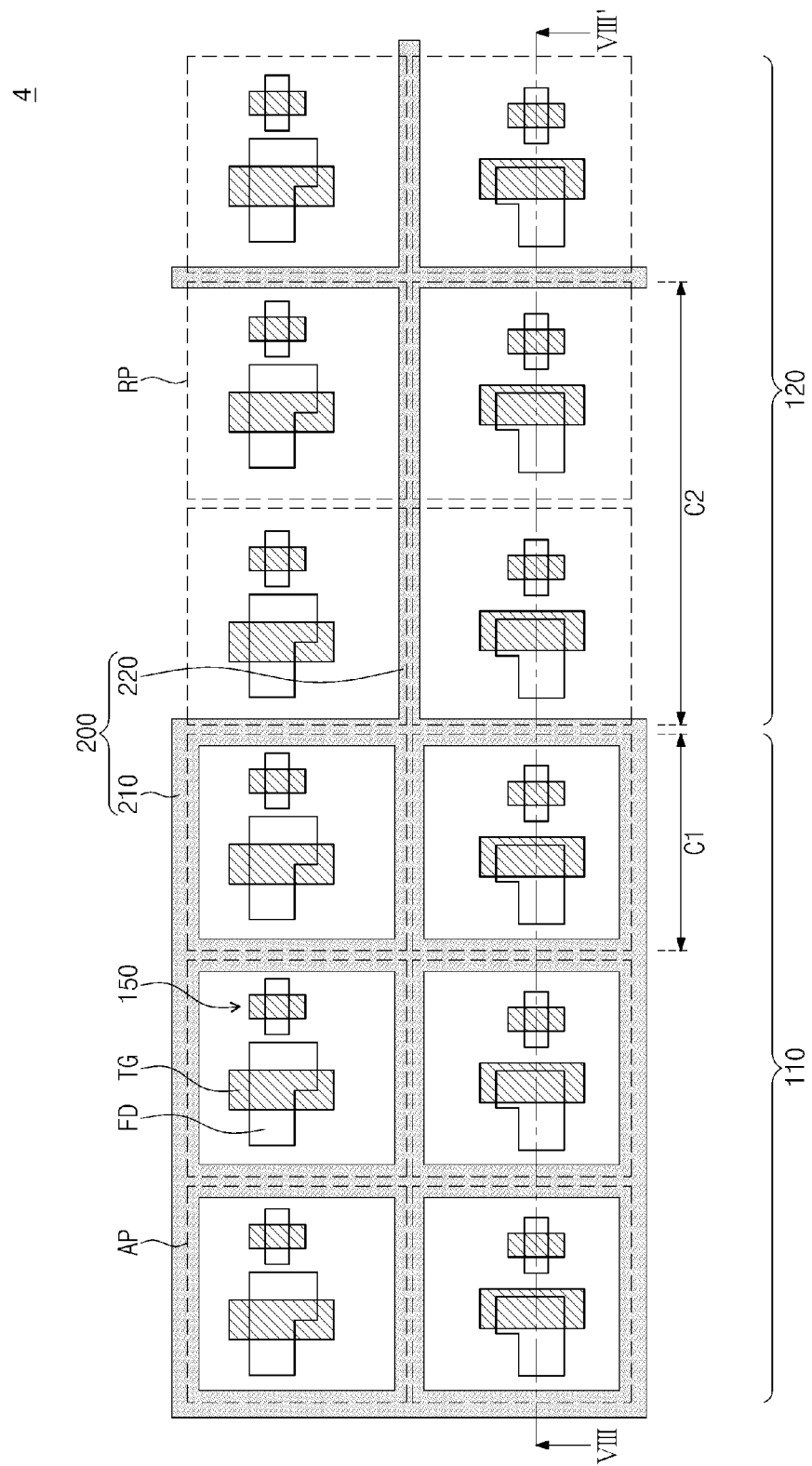
FIG. 8A is a plan view illustrating an image sensor according to at least one example embodiment of the inventive concepts.
Figure 8B:
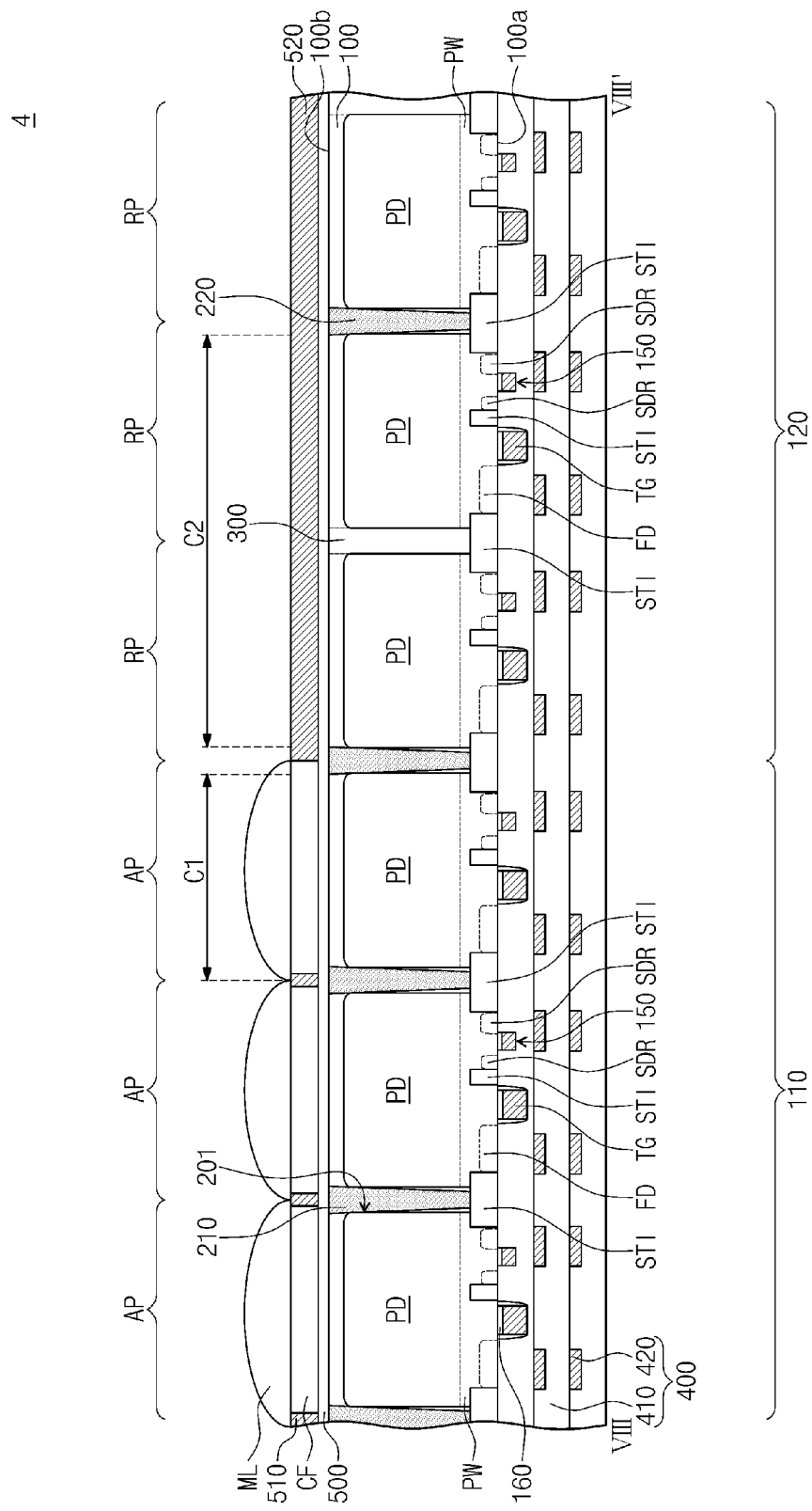
FIG. 8B is a cross-sectional view taken along a line VIII-VIII of FIG. 8A.

In at least one example embodiment illustrated in FIGS. 8A and 8B, a distance C2 between the device isolation patterns 200 in the light-shielding region 120 may be greater than a distance C1 between the device isolation patterns 200 in the light-receiving region 110. In at least one example embodiment, the first device isolation pattern 210 may be between the active pixels AP to surround each of the active pixels AP. In at least one example embodiment, the second device isolation pattern 220 may be between some of the reference pixels RP, but may not be between others of the reference pixels RP.

In at least one example embodiment, the second device isolation patterns 220 shown in FIGS. 6A, 6B, 7A, 7B, 8A, and 8B may be combined with each other. In at least one example embodiment, the second device isolation pattern 220 may have both the depth lower than that of the first device isolation pattern 210 as illustrated in FIGS. 6A and 6B, and the width narrower than that of the first device isolation pattern 220 as illustrated in FIGS. 7A and 7B.

As illustrated in FIGS. 6B, 7B, and 8B, a total area of an interface between the second device isolation pattern 220 and the substrate 100 in a unit area may be smaller than that of an interface between the first device isolation pattern 210 and the substrate 100 in a unit area. The number of the reference pixels RP in the unit area may be equal to the number of the active pixels AP in the unit area. As a result, a noise signal caused by a dark current in the reference pixels RP may be less than a noise signal caused by a dark current in the active pixels AP. In at least one example embodiment, optical characteristics of the image sensors 2, 3 and 4 may be improved.

Figure 9A:
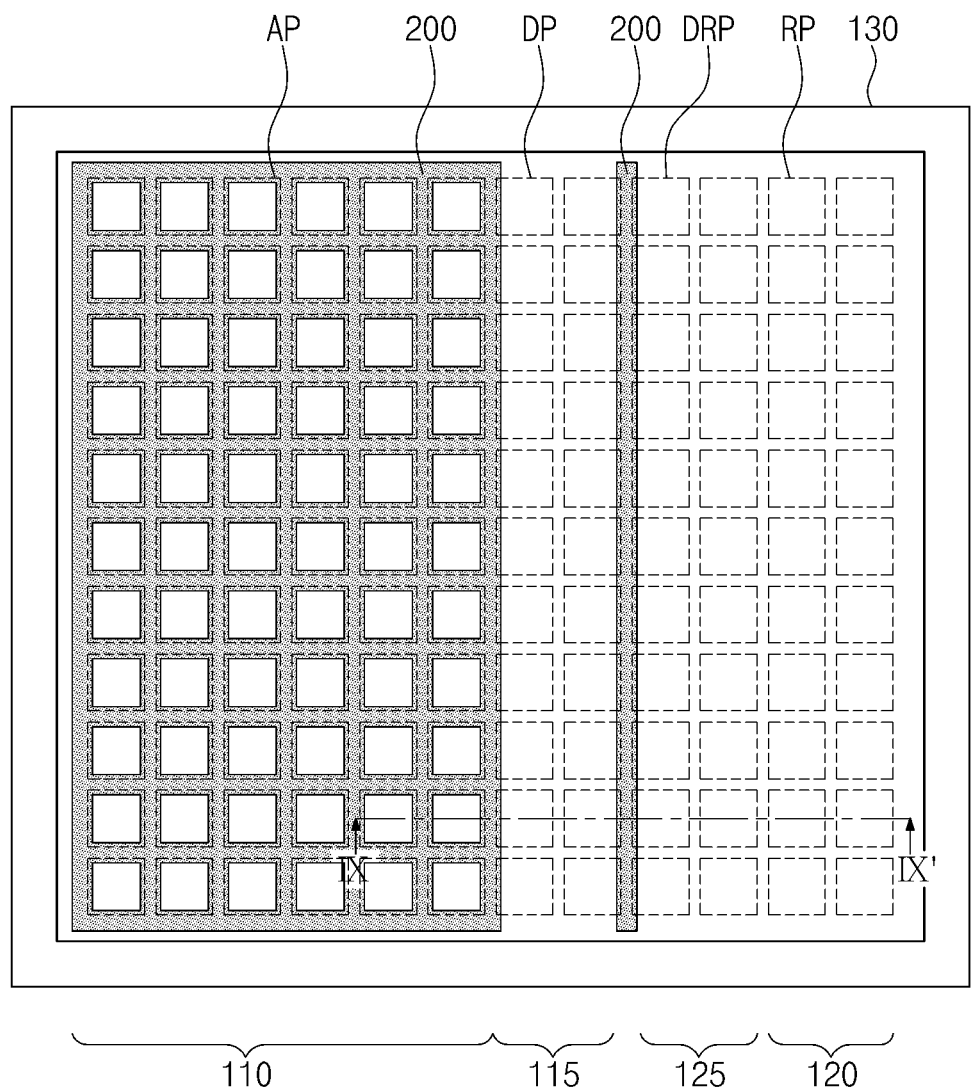
FIG. 9A is a plan view illustrating an image sensor according to at least one example embodiment of the inventive concepts.
Figure 9B:
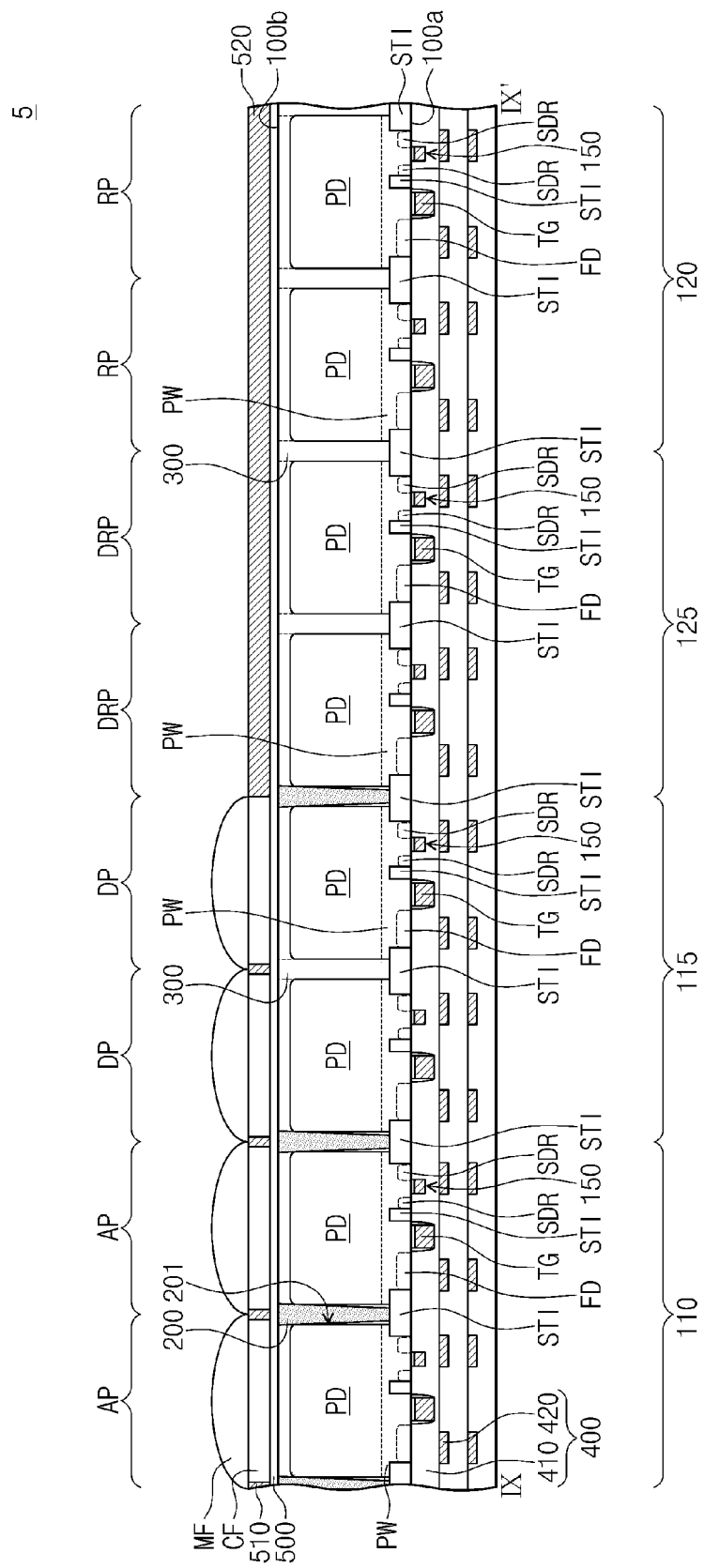
FIG. 9B is a cross-sectional view taken along a line IX-IX of FIG. 9A.

FIG. 9A is a plan view illustrating an image sensor according to at least one example embodiment of the inventive concepts. FIG. 9B is a cross-sectional view taken along a line IX-IX' of FIG. 9A. Hereinafter, the descriptions mentioned above will be omitted or mentioned briefly to avoid duplication of explanation.

Referring to FIGS. 9A and 9B, a substrate 100 of an image sensor 5 may include a light-receiving region 110, a dummy region 115, a dummy light-shielding region 125, and a light-shielding region 120. The light-receiving region 110 and the light-shielding region 120 may be the same as described with reference to FIGS. 4A, 4B, 5A, and 5B. For example, the light-receiving region 110 may not be covered by a light-shielding pattern 520, as illustrated in FIG. 9B. A plurality of active pixels AP may be in the light-receiving region 110. The active pixels AP may output electrical signals generated by incident light and noise signals. The light-shielding region 120 may be covered by the light-shielding pattern 520. A plurality of reference pixels RP may be in the light-shielding region 120. The reference pixel RP may output a noise signal (e.g., a reference signal).

The dummy region 115 may be between the light-receiving region 110 and the light-shielding region 120. In more detail, the dummy region 115 may be between the light-receiving region 110 and the dummy light-shielding region 125. The dummy region 115 may not covered by the light-shielding pattern 520. Dummy pixels DP may be in the dummy region 115. The dummy pixels DP may not output an electrical signal.

The dummy light-shielding region 125 may be covered by the light-shielding pattern 520, so light may not be incident on the dummy light-shielding region 125. The light-receiving region 110 may be more adjacent to the dummy light-shielding region 125 than to the light-shielding region 120. A plurality of dummy reference pixels DRP may be in the dummy light-shielding region 125. The dummy reference pixels DRP may not output an electrical signal.

In at least one example embodiment, the light-receiving region 110 may correspond to the core of the substrate 100 and the light-shielding region 120 may correspond to the edge portion of the substrate 100, as illustrated in FIG. 4A. In this case, the dummy region 115 may be between the light-receiving region 110 and the light-shielding region 120 to surround the light-receiving region 110, and the dummy light-shielding region 125 may be between the dummy region 115 and the light-shielding region 120 to surround the dummy region 115.

A device isolation region 300 may be in the substrate 100 of the light-shielding region 120, the dummy light-shielding region 125 and the dummy region 115 to define the reference pixels RP, the dummy reference pixels DRP, and the dummy pixels DP. The device isolation region 300 may be a dopant region formed by doping a portion of the substrate 100 with dopants. The device isolation region 300 may be doped with dopants of a first conductivity type (e.g., P-type dopants).

A device isolation pattern 200 may be in a trench 201 recessed from the second surface 100*b* of the substrate 100. The device isolation pattern 200 may include an insulating material of which a refractive index is lower than that of the substrate 100. The device isolation pattern 200 may include a different material from the substrate 100 so an interface may be formed between the device isolation pattern 200 and the substrate 100. The device isolation pattern 200 may define the active pixels AP in the light-receiving region 110 of the substrate 100. The device isolation pattern 200 may reduce and/or prevent occurrence of crosstalk between the active pixels AP. The device isolation pattern 200 may also be between the light-receiving region 110 and the dummy region 115, and between the dummy region 115 and the dummy light-shielding region 125 to isolate the light-receiving region 110 from the dummy region 115 and to isolate the dummy region 115 from the dummy light-shielding region 125. In at least one example embodiment, the device isolation pattern 200 may be further between the dummy light-shielding region 125 and the light-shielding region 120 to isolate the dummy light-shielding region 125 from the light-shielding region 120.

In at least one example embodiment, the device isolation region 300 may not be formed in the dummy region 115, and the device isolation pattern 200 may be further in the dummy region 115 to define the dummy pixels DP. In at least one example embodiment, the device isolation region 300 may not be formed in the dummy light-shielding region 125, and the device isolation pattern 200 may be further in the dummy light-shielding region 125 to define the dummy reference pixels DRP. In at least one example embodiment, any one of the dummy region 115 and the dummy light-shielding region 125 may be omitted.

The active pixels AP, the dummy pixels DP, the dummy reference pixels DRP, and the reference pixels RP may have the same planar area and the same volume, as illustrated in FIG. 9A. Referring to FIG. 9B, a shallow device isolation layer STI, a photoelectric conversion part PD, a well region PW, a floating diffusion region FD, and source/drain regions SDR may be in each of the pixels AP, DP, DRP, and RP. A transfer gate TG and at least one element 150 may be on the first surface 100*a* of the substrate 100 of each of the pixels AP, DP, DRP, and RP. The photoelectric conversion parts PD, the well regions PW, the floating diffusion regions FD, and the transfer gates TG of the active, dummy, dummy reference, and reference pixels AP, DP, DRP, and RP may be the substantially same as each other. The photoelectric conversion parts PD may be doped with dopants of a second conductivity type (e.g., N-type dopants).

An interconnection structure 400 may cover the transfer gates TG and the elements 150 on the first surface 100*a* of the substrate 100. An anti-reflection layer 500, a grid pattern 510, the light-shielding pattern 520, color filters CF, and micro-lenses ML may be on the second surface 100*b* of the substrate 100.

Figure 10A:
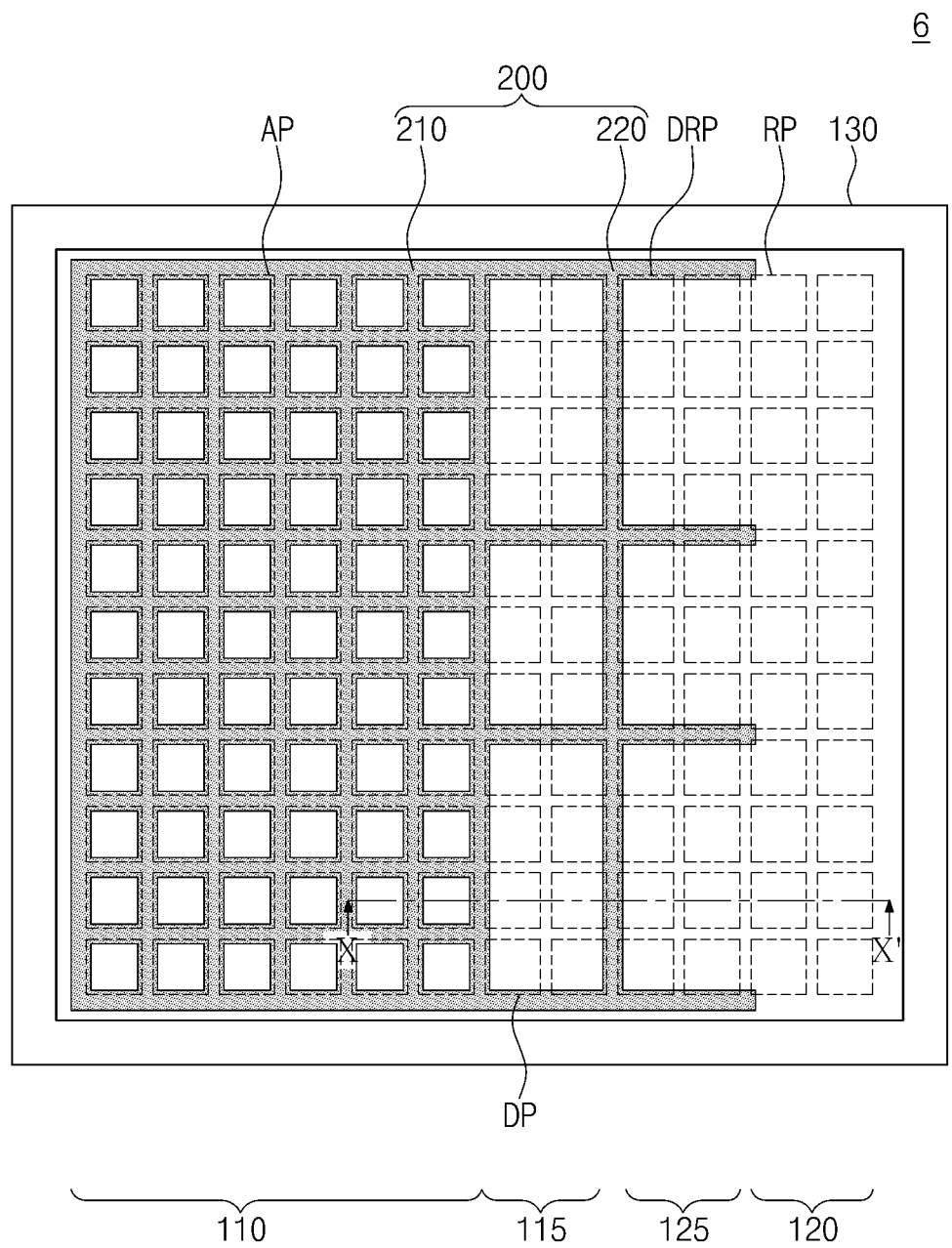
FIG. 10A is a plan view illustrating an image sensor according to at least one example embodiment of the inventive concepts.
Figure 10B:
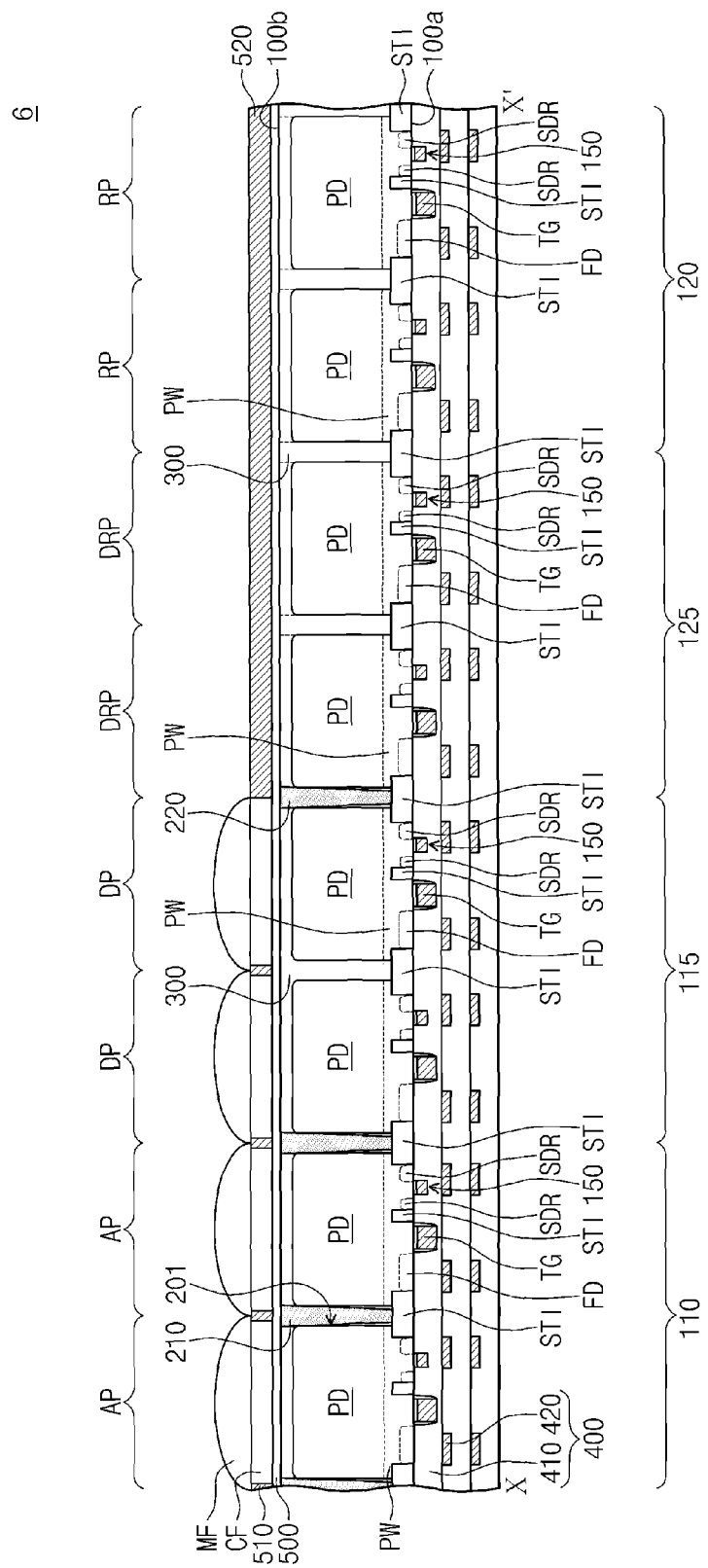
FIG. 10B is a cross-sectional view taken along a line X-X of FIG. 10A.

FIG. 10A is a plan view illustrating an image sensor according to at least one example embodiment of the inventive concepts. FIG. 10B is a cross-sectional view taken along a line X-X' of FIG. 10A. Hereinafter, the descriptions mentioned above will be omitted or mentioned briefly to avoid duplication of explanation.

Referring to FIGS. 10A and 10B, a substrate 100 of an image sensor 6 may include a light-receiving region 110, a dummy region 115, a dummy light-shielding region 125, and a light-shielding region 120. The light-receiving region 110, the dummy region 115, the dummy light-shielding region 125, and the light-shielding region 120 may be the same as described with reference to FIGS. 9A and 9B. In other embodiments, any one of the dummy region 115 and the dummy light-shielding region 125 may be omitted.

A device isolation region 300 may be in the substrate 100 of the light-shielding region 120, the dummy light-shielding region 125, and the dummy region 115 to define reference pixels RP, dummy reference pixels DRP, and the dummy pixels DP. The device isolation region 300 may be a dopant region formed by doping a portion of the substrate 100 with dopants. A conductivity type of the dopants of the device isolation region 300 may be different from that of dopants of a photoelectric conversion part PD. For example, the device isolation region 300 may be doped with dopants of a first conductivity type (e.g., P-type dopants). Since the reference pixels RP are defined by the device isolation region 300, a dark current of the reference pixels RP may be reduced and/or minimized.

A device isolation pattern 200 may include a first device isolation pattern 210 and a second device isolation pattern 220. The first and second device isolation patterns 210 and 220 may be in a trench 201 recessed from the second surface 100b of the substrate 100. The first and second device isolation patterns 210 and 220 may include an insulating material of which a refractive index is lower than that of the substrate 100. The first and second device isolation patterns 210 and 220 may include a different material from the substrate 100, so interfaces may be formed between the substrate 100 and the first and second device isolation patterns 210 and 220. The first device isolation pattern 210 may be in the substrate 100 of the light-receiving region 110 to define the active pixels AP. The first device isolation pattern 210 may also be between the light-receiving region 110 and the dummy region 115 and between the dummy region 115 and the dummy light-shielding region 125 to separate the light-receiving region 110 from the dummy region 115 and to separate the dummy region 115 from the dummy light-shielding region 125. Unlike FIGS. 10A and 10B, the first device isolation pattern 210 may be further provided between the dummy light-shielding region 125 and the light-shielding region 120 to separate the dummy light-shielding region 125 from the light-shielding region 120.

The second device isolation pattern 220 may be in the dummy region 115 and the dummy light-shielding region 125 of the substrate 100. A shape and arrangement of the second device isolation pattern 220 may be different from those of the first device isolation pattern 210. In at least one example embodiment, the second device isolation pattern 220 may be shallower than the first device isolation pattern 210, as described with reference to FIGS. 6A and 6B. In at least one example embodiment, the second device isolation pattern 220 may be narrower than the first device isolation pattern 210, as described with reference to FIGS. 7A and 7B. In at least one example embodiment, a distance between the second device isolation patterns 220 may be greater than a distance between the first device isolation patterns 210, as described with reference to FIGS. 8A and 8B. In at least one example embodiment, the second device isolation pattern 210 may include a combination of at least two of the features of the embodiments of FIGS. 6A, 6B, 7A, 7B, 8A, and 8B.

In at least one example embodiment, the second device isolation pattern 220 may be in one of the dummy region 115 and the dummy light-shielding region 125 but may not be in the other of the dummy region 115 and the dummy light-shielding region 125. In at least one example embodiment, the second device isolation pattern 220 may be further provided in the light-shielding region 120 of the substrate 100.

The active pixels AP, the dummy pixels DP, the dummy reference pixels DRP, and the reference pixels RP may have the same planar area and the same volume. A shallow device isolation layer STI, a photoelectric conversion part PD, a well region PW, a floating diffusion region FD, source/drain regions SDR, a transfer gate TG, and at least one element 150 may be in each of the pixels AP, DP, DRP, and RP. The photoelectric conversion parts PD, the well regions PW, the floating diffusion regions FD, and the transfer gates TG of the active, dummy, dummy reference, and reference pixels AP, DP, DRP, and RP may be the substantially same as each other. The photoelectric conversion parts PD may be doped with dopants of a second conductivity type (e.g., N-type dopants).

An interconnection structure 400 may cover the transfer gates TG and the elements 150 on the first surface 100a of the substrate 100. An anti-reflection layer 500, a grid pattern 510, a light-shielding pattern 520, color filters CF, and micro-lenses ML may be on the second surface 100b of the substrate 100.

FIGS. 11A to 11D are cross-sectional views illustrating a method of forming an image sensor according to at least one example embodiment of the inventive concepts. Hereinafter, the descriptions mentioned above will be omitted or mentioned briefly to avoid duplication of explanation.

Figure 11A:
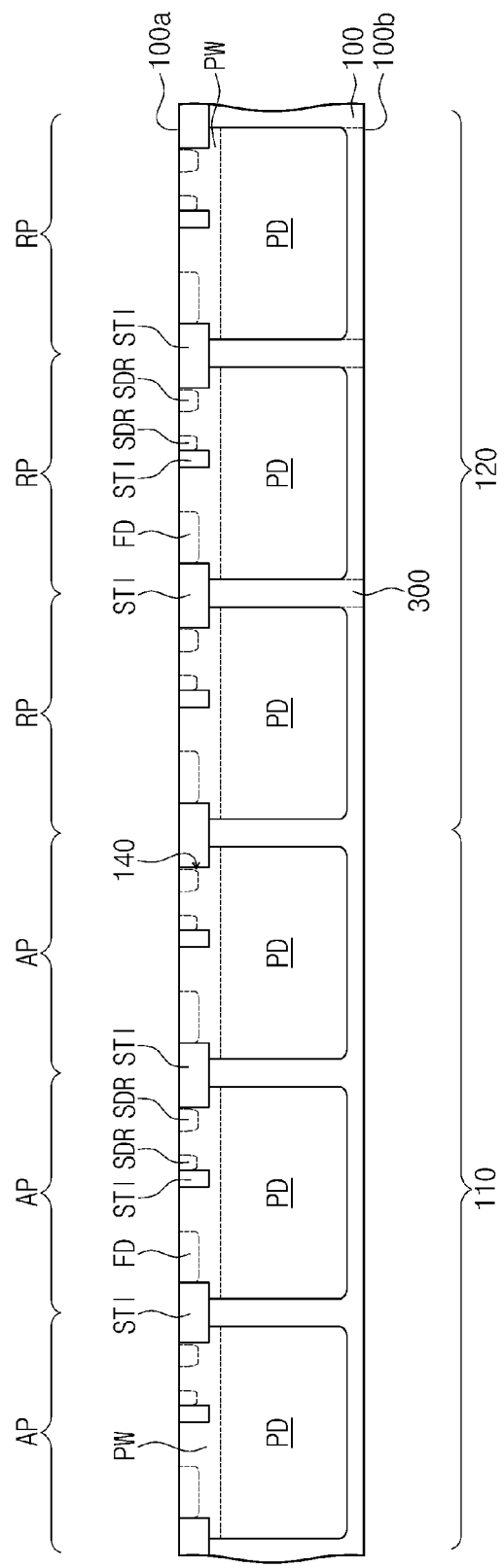
FIGS. 11A to 11D are cross-sectional views illustrating a method of forming an image sensor according to at least one example embodiment of the inventive concepts.

Referring to FIG. 11A, a substrate 100 including a light-receiving region 110 and a light-shielding region 120 may be prepared. At this time, a first surface of the substrate 100 may face upward. A plurality of doping processes may be performed on the first surface 100a of the substrate 100 to form a plurality of photoelectric conversion parts PD, a plurality of well regions PW, a plurality of floating diffusion regions FD, and a plurality of source/drain regions SDR in each of the light-receiving region 110 and the light-shielding region 120. The substrate 100, the photoelectric conversion parts PD, the well regions PW, the floating diffusion regions FD, and the source/drain regions SDR may be the same as described with reference to FIGS. 5A and 5B. The photoelectric conversion parts PD and the floating diffusion regions FD may be formed by doping portions of the substrate 100 with dopants of the second conductivity type (e.g., N-type dopants). The well regions PW and the source/drain regions SDR may be formed by doping portions of the substrate 100 with dopants of the first conductivity type (e.g., P-type dopants). A doping process (e.g., an ion implantation process) using dopants of the first conductivity type (e.g., P-type dopants) may be performed on the first surface 100a of the substrate 100 to form a device isolation region 300. In at least one example embodiment, the ion implantation process may be performed on the first surface 100a of the substrate 100 of the light-shielding region 120 to form the device isolation region 300 defining reference pixels RP. The reference pixels RP may be the same as described with reference to FIGS. 5A and 5B. The device isolation region 300 may be formed together with the well regions PW or the source/drain regions SDR by the same doping process. In at least one example embodiment, the device isolation region 300 may be formed by an additional doping process different from the doping process of forming the well regions PW and the source/drain regions SDR.

A shallow device isolation layer STI may be formed in the substrate 100 to define active regions in the reference pixels RP and active pixels AP to be defined. In at least one example embodiment, forming the shallow device isolation layer STI may include etching the first surface 100a of the substrate 100 to form a shallow trench 140, and filling the shallow trench 140 with an insulating material. The shallow device isolation layer ST1 may be formed in the floating diffusion regions FD and the source/drain regions SDR.

Figure 11B:
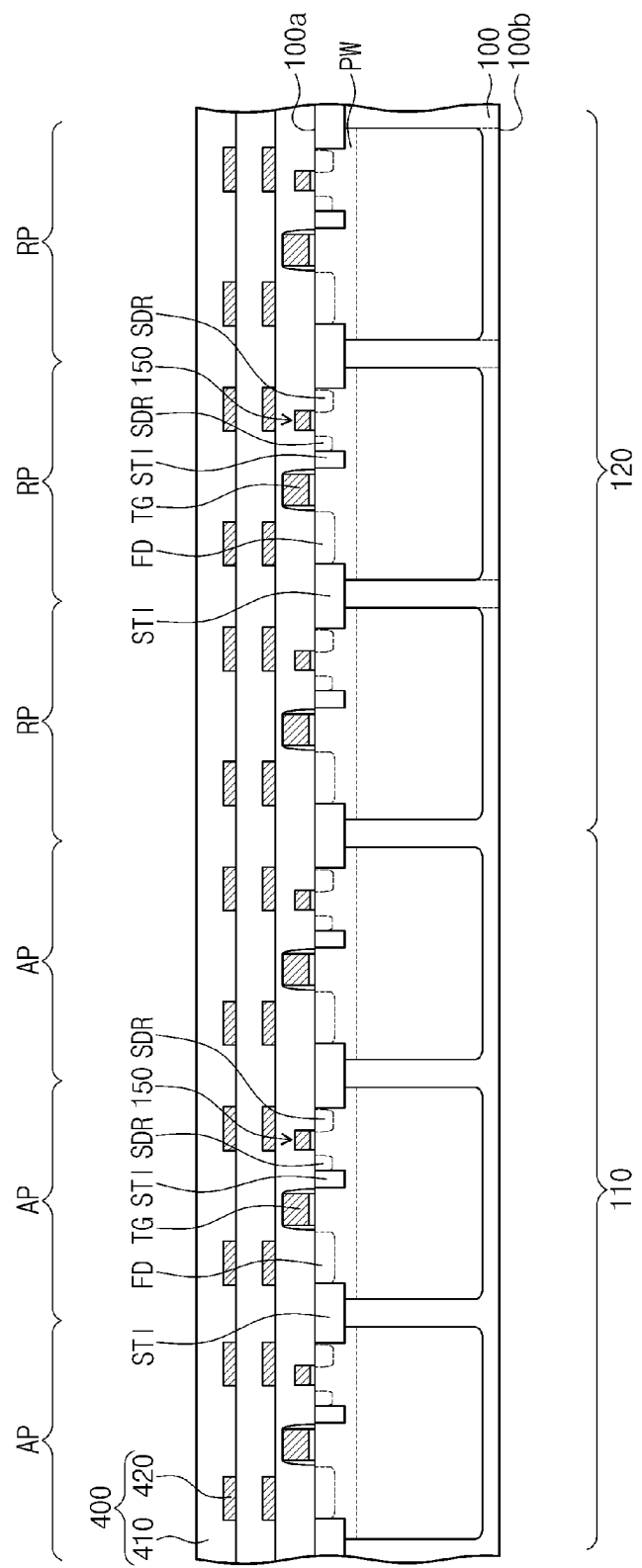

Referring to FIG. 11B, transfer gates TG and gates of elements 150 may be formed on the first surface 100a of the substrate 100. A plurality of the transfer gates TG and a plurality of the gates of the elements 150 may be formed in each of the light-receiving region 110 and the light-shielding region 120. The source/drain regions SDR may correspond to sources and drains of the elements 150. For example, the transfer gate TG and at least one element 150 may be formed in each of the active and reference pixels AP and RP. The transfer gates TG and the elements 150 may be the same as described with reference to FIGS. 5A and 5B. In at least one example embodiment, the floating diffusion regions FD and the source/drain regions SDR may be formed after the formation of the transfer gates TG and the gates of the elements 150. An interconnection structure 400 may be formed on the first surface 100a of the substrate 100. The interconnection structure 400 may include interlayer insulating layers 410 and interconnections 420. Thereafter, the substrate 100 may be overturned, so a second surface 100b of the substrate 100 may face upward.

Figure 11C:
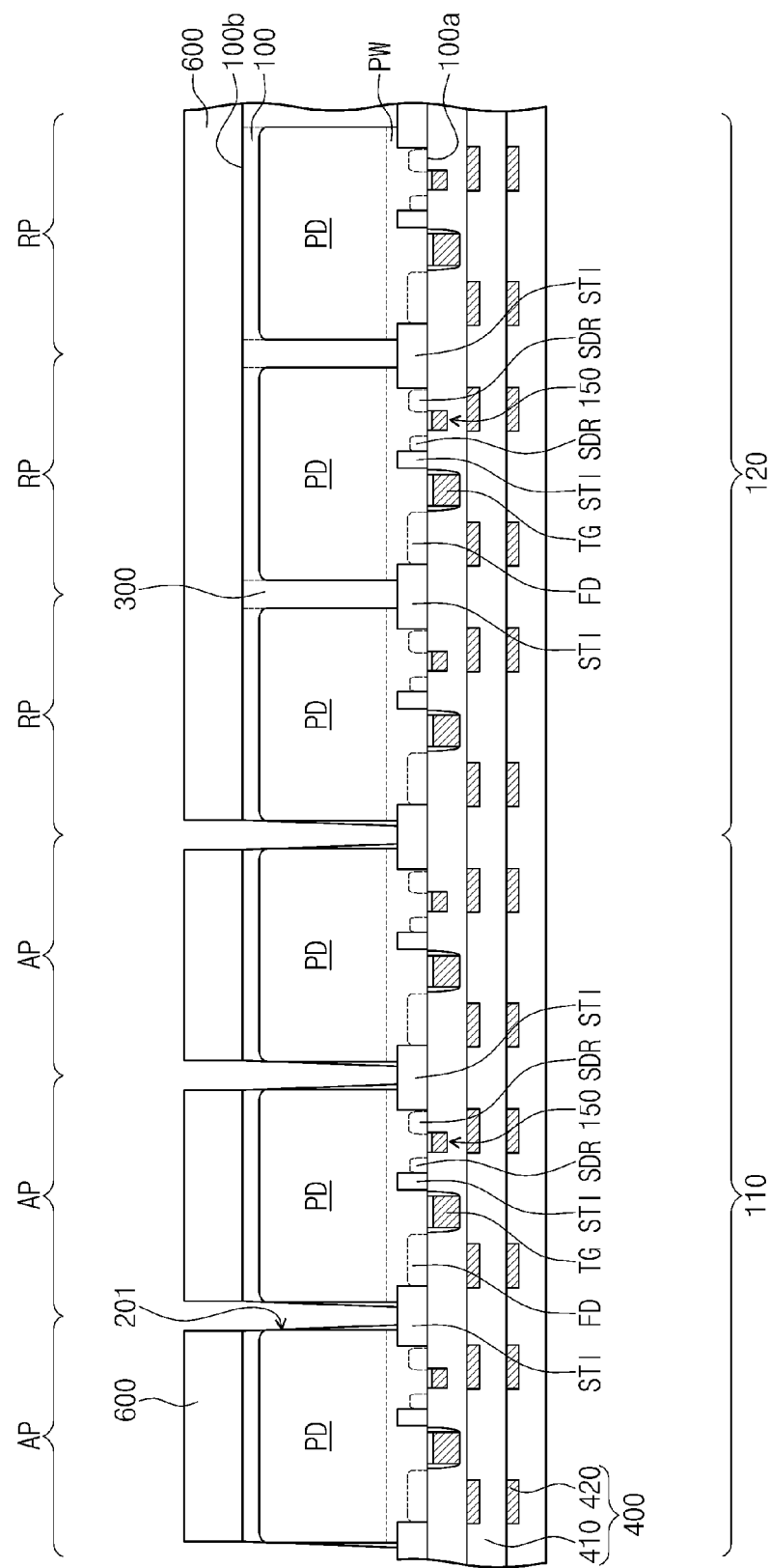

Referring to FIG. 11C, a mask pattern 600 may be formed on the second surface 100b of the substrate 100. The mask pattern 600 may expose a portion of the substrate 100 of the light-receiving region 110 but may not expose the substrate 100 of the light-shielding region 120. The second surface 100b of the substrate 100 exposed by the mask pattern 600 may be etched to form a trench 201 in the substrate 100 of the light-receiving region 110. A width of a top end of the trench 201 may be greater than a width of a bottom end of the trench 201. Interface defects (e.g., dangling bonds) may be formed on a bottom surface and a sidewall of the trench 201 during the etching process. At this time, an additional process for removing the interface defects may not be performed in the trench 201. In at least one example embodiment, a deposition process of forming a liner layer (not shown) and/or a doping process of forming a dopant region (not shown) may be omitted. Since the deposition process and/or the doping process is not performed, it is possible to prevent the doped regions (e.g., the photoelectric conversion parts PD, the well regions PW, the floating diffusion regions FD, the source/drain regions SDR, and the device isolation region 300 and/or the interconnection structure 400 from being damaged. Since the substrate 100 of the light-shielding region 120 is not exposed during the etching process, the interface defects by the etching process may not be generated in the reference pixels RP. Next, the mask pattern 600 may be removed.

Figure 11D:
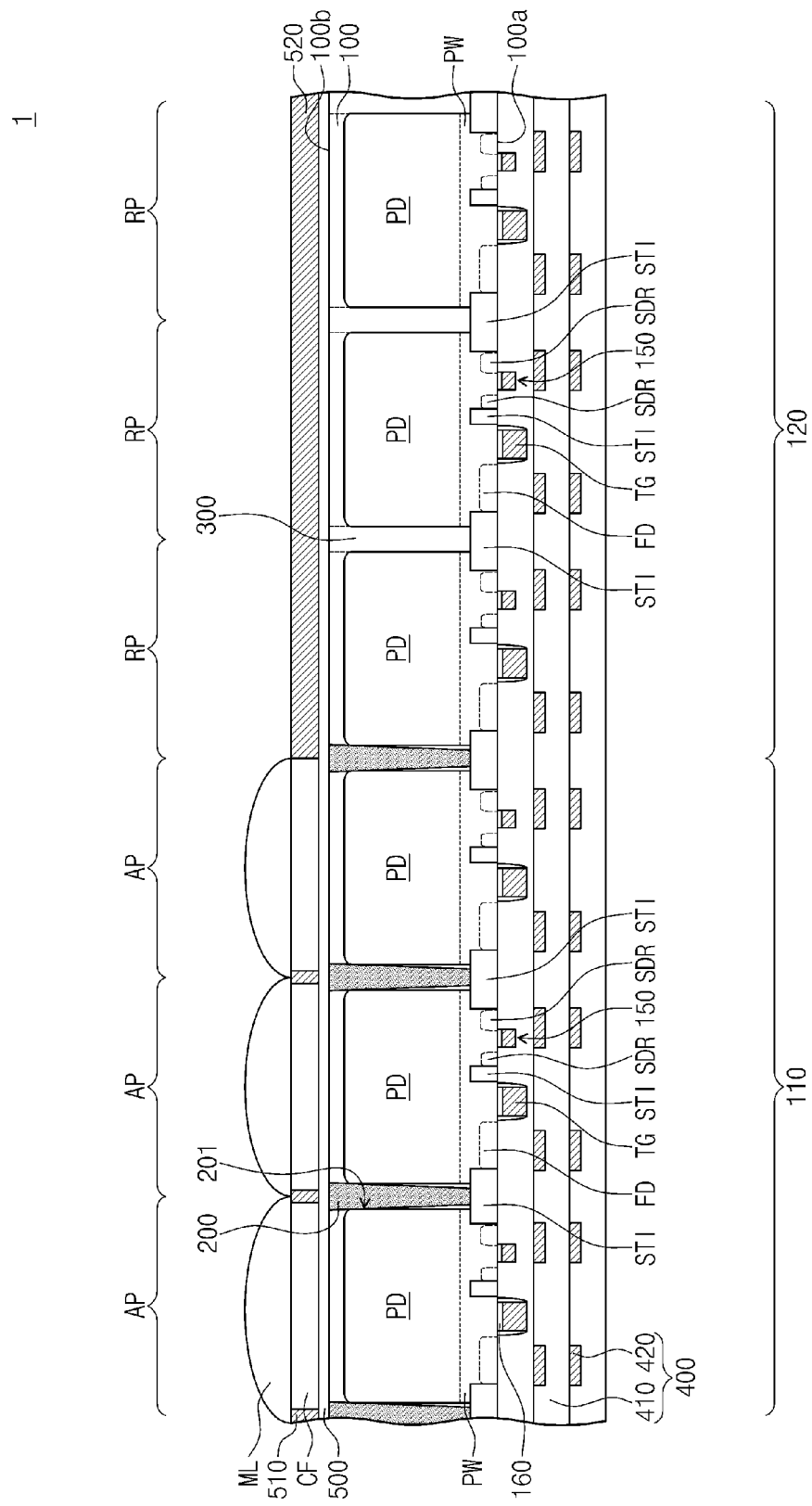

Referring to FIG. 11D, the trench 201 may be filled with an insulating material, so a device isolation pattern 200 may be formed in the substrate 100. The active pixels AP may be defined in the light-receiving region 110 of the substrate 100 by the device isolation pattern 200. Each of the active pixels AP may include the photoelectric conversion part PD, the well region PW, the floating diffusion region FD, and the source/drain regions SDR. At this time, the interface defects formed by the etching process of FIG. 11C may remain between the substrate 100 and the device isolation pattern 200. In other embodiments, the device isolation pattern 200 may extend onto the second surface 100b of the substrate 100 to cover the second surface 100b.

An anti-reflection layer 500, a grid pattern 510, and a light-shielding pattern 520 may be formed on the second surface 100b of the substrate 100. The anti-reflection layer 500, the grid pattern 510, and the light-shielding pattern 520 may be the same as described with reference to FIGS. 5A and 5B. The light-shielding pattern 520 and the grid pattern 510 may be formed by the same process. In at least one example embodiment, forming the grid pattern 510 and the light-shielding pattern 520 may include forming a metal layer (not shown) on the anti-reflection layer 500, and patterning the metal layer (not shown). In at least one example embodiment, the light-shielding pattern 520 may be formed by an additional process different from the process of forming the grid pattern 510. In at least one example embodiment, the grid pattern 510 may not be formed. Color filters CF and micro-lenses ML may be formed on the anti-reflection layer 500 in the active pixels AP, respectively. The color filters CF and the micro-lenses ML may be the same as described with reference to FIGS. 5A and 5B. An image sensor 1 may be manufactured by the processes described above.

Since the reference pixels RP are defined by the device isolation region 300, the reference pixels RP may generate reference signals from which noise signals caused by interface defects are removed. Thus, the noise signals caused by the interface detects may be removed from electrical signals of the active pixels AP by the reference signals without formation of the additional liner layer and/or the doped region in the trench 201 of the light-receiving region 110. According to at least one example embodiment of the inventive concepts, damage of the image sensor 1 may be prevented during the manufacturing processes, and optical characteristics of the image sensor 1 may be improved.

In at least one example embodiment, unlike FIG. 11C, an additional trench may be further formed in the device isolation region 300 of the light-shielding region 120. The additional trench may be formed simultaneously with the trench 201 or may be formed by an etching process different from the etching process of forming the trench 201. Thereafter, the additional trench may be filled with an insulating material to form one of the second device isolation patterns 220 illustrated in FIGS. 6A, 6B, 7A, 7B, 8A, and 8B.

Figure 12A:
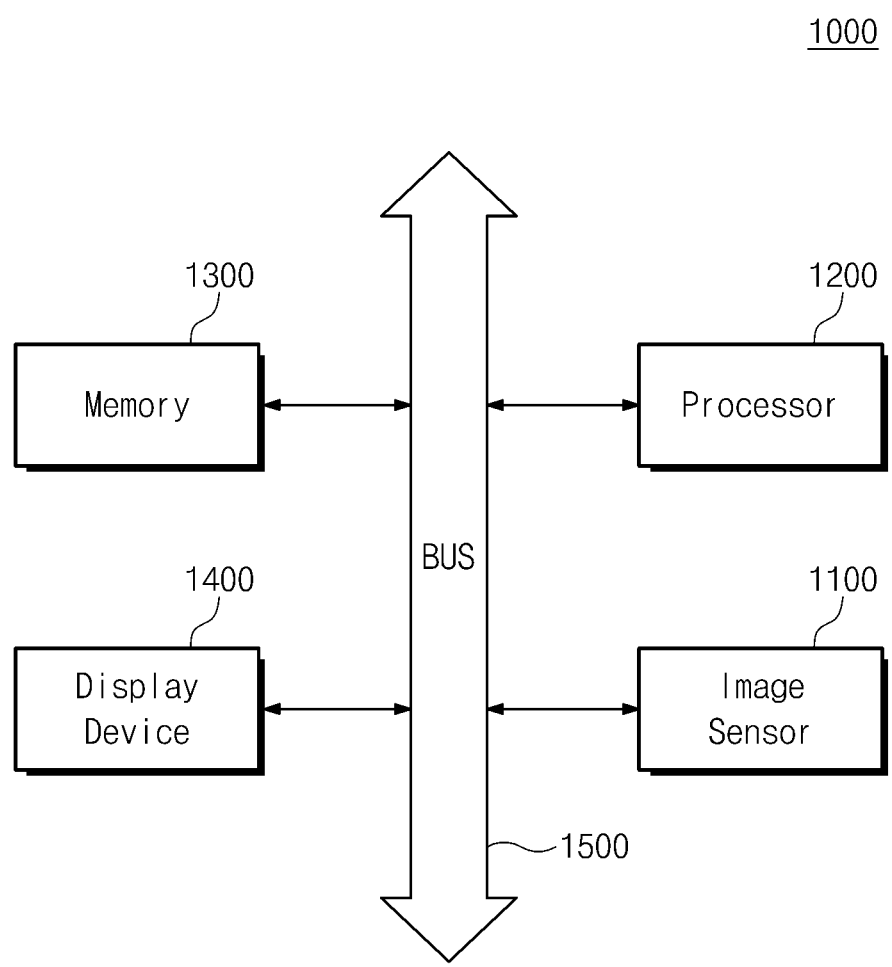
FIG. 12A is a schematic block diagram illustrating a processor-based system implemented with an image sensor according to at least one example embodiment of the inventive concepts.
Figure 12B:
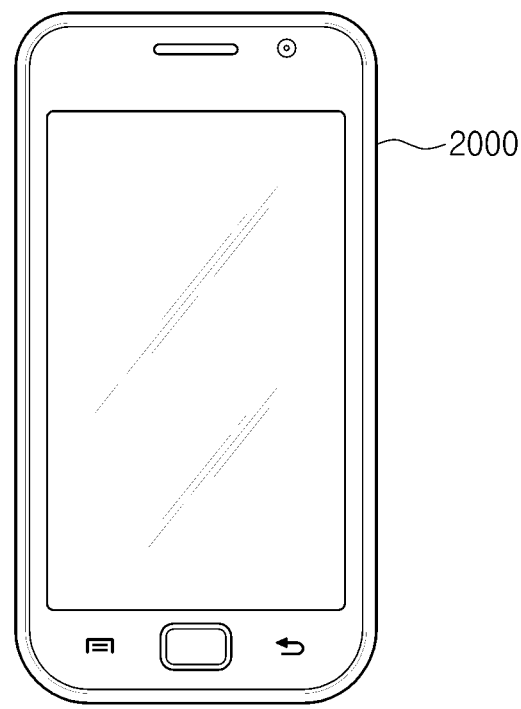
FIG. 12B illustrates an electronic device implemented with an image sensor according to at least one example embodiment of the inventive concepts.

FIG. 12A is a schematic block diagram illustrating a processor-based system implemented with an image sensor according to at least one example embodiment of the inventive concepts. FIG. 12B illustrates an electronic device implemented with an image sensor according to at least one example embodiment of the inventive concepts. The electronic device may be a digital camera or a mobile device.

Referring to FIG. 12A, a processor-based system 1000 may include an image sensor 1100, a processor 1200, a memory device 1300, a display device 1400, and a system bus 1500. As illustrated in FIG. 12A, the image sensor 1100 may capture external image information in response to control signals of the processor 1200. The processor 1200 may store the captured image information into the memory device 1300 through the system bus 1500. The processor 1200 may display the image information stored in the memory device 1300 on the display device 1400.

The system 1000 may be a computer system, a camera system, a scanner, a mechanized clock system, a navigation system, a video phone, a management system, an auto-focus system, a tracking system, a sensing system, or an image stabilization system. However, the inventive concepts are not limited thereto. If the processor-based system 1000 is applied to the mobile device, the system 100 may further include a battery used to supply an operating voltage to the mobile device.

FIG. 12B illustrates a mobile phone 2000 implemented with the image sensor according to at least one example embodiment of the inventive concepts. In at least one example embodiment, the image sensor may be applied to a smart phone, a personal digital assistant (PDA), a portable multimedia player (PMP), a digital multimedia broadcast (DMB) device, a global positioning system (GPS) device, a handled gaming console, a portable computer, a web tablet, a wireless phone, a digital music player, a memory card, and/or other electronic products transmitting and/or receiving information by wireless.

According to at least one example embodiment of the inventive concepts, the active pixels may be defined by the device isolation pattern, and thus, the crosstalk between the active pixels may be prevented. In addition, the reference pixels may be defined by the device isolation region, and thus, the interface defects may not be generated between the device isolation region and the substrate. In other words, the reference pixels may generate electrical signals which have reduced noise signals or do not have the noise signals. The electrical signals generated from the reference pixels may be used as the reference signals, so the image sensor may output the photoelectric signals from which the noise signals caused by the dark current are removed. As a result, the optical characteristics of the image sensor may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:
   a substrate including,
      a light-receiving region, and
      a light-shielding region;
   a device isolation pattern in the light-receiving region of the substrate, the device isolation pattern configured to define active pixels; and
   a device isolation region in the light-shielding region of the substrate, the device isolation region configured to define reference pixels, the device isolation pattern including a different material from a material of the device isolation region.

2. The image sensor of claim 1, wherein the device isolation pattern includes an insulating material filling a trench in the substrate.

3. The image sensor of claim 2, wherein the device isolation pattern comprises:
   a first device isolation pattern in the light-receiving region; and
   a second device isolation pattern between the reference pixels in the light-shielding region,
   wherein a shape of the second device isolation pattern is different from a shape of the first device isolation pattern.

4. The image sensor of claim 1, wherein the device isolation region is a dopant region, the dopant region including a portion of the substrate including dopants.

5. The image sensor of claim 1, further comprising:
   a photoelectric conversion part in the substrate of each of the active pixels and the reference pixels.

6. The image sensor of claim 5, wherein structures of the photoelectric conversion parts in the reference pixels are the same as or symmetrical to those of the photoelectric conversion parts in the active pixels.

7. The image sensor of claim 1, wherein the device isolation pattern includes a material having a refractive index lower than that of the substrate.

8. The image sensor of claim 1, wherein the substrate further comprises: a dummy region between the light-receiving region and the light-shielding region,
   the dummy region including a plurality of dummy pixels.

9. An image sensor comprising:
   a substrate including active pixels and reference pixels,
   the active pixels being defined by a device isolation pattern filling a trench formed in the substrate, and
   the reference pixels being defined by a dopant region including a portion of the substrate including dopants.

10. The image sensor of claim 9, further comprising:
    photoelectric conversion parts in the substrate of the active pixels and the reference pixels, respectively.

11. The image sensor of claim 10, wherein the photoelectric conversion parts are adjacent to a first surface of the substrate, and
    wherein the trench extends from a second surface of the substrate into the substrate, and
    wherein the second surface is opposite to the first surface.

12. The image sensor of claim 11, further comprising:
    a shallow device isolation layer in the substrate to define active regions,
    wherein the shallow device isolation layer is adjacent to the first surface of the substrate.

13. The image sensor of claim 11, further comprising:
    transfer gates on the first surface of the substrate, the transfer gates on the photoelectric conversion parts, respectively;
    an interconnection structure covering the transfer gates on the first surface of the substrate; and
    a color filter and a micro-lens on the second surface of the substrate of each of the active pixels.

14. The image sensor of claim 10, wherein the dopant region is doped with dopants of a first conductivity type, and
    wherein the photoelectric conversion parts are doped with dopants of a second conductivity type different from the first conductivity type.

15. The image sensor of claim 9, wherein the reference pixels have the same shape and the same area as the active pixels when viewed from a plan view.

16. The image sensor of claim 9, further comprising:
    a light-shielding pattern on the substrate to cover the reference pixels,
    wherein the active pixels are exposed by the light-shielding pattern.

17. An image sensor comprising:
    a substrate including,
       a light-receiving region including a device isolation pattern, the device isolation pattern defining active pixels; and
       a light-shielding region including a device isolation region, the device isolation region defining reference pixels;
       wherein the device isolation pattern includes a different material than the device isolation region.

18. The image sensor of claim 17, wherein the device isolation region includes dopants.

19. The image sensor of claim 17, wherein the device isolation pattern includes an insulating material in a trench of the substrate.

* * * * *